United States Patent
Kawamoto

(10) Patent No.: US 8,134,392 B2
(45) Date of Patent: Mar. 13, 2012

(54) PHASE LOCKED LOOP

(75) Inventor: Takashi Kawamoto, Kodaira (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/622,604

(22) Filed: Nov. 20, 2009

(65) Prior Publication Data

US 2010/0134163 A1    Jun. 3, 2010

(30) Foreign Application Priority Data

Nov. 28, 2008   (JP) ................................. 2008-303616

(51) Int. Cl.
    *H03L 7/06*   (2006.01)
(52) U.S. Cl. .......... 327/156; 327/147; 327/163; 331/10; 331/14; 331/16; 331/17; 331/44
(58) Field of Classification Search .................. 327/147, 327/148, 156, 157, 162, 163; 331/10, 14, 331/16, 17, 18, 44
See application file for complete search history.

(56) References Cited

U.S. PATENT DOCUMENTS

| | | | |
|---|---|---|---|
| 6,714,087 B2 | 3/2004 | Sakurai et al. | |
| 6,870,411 B2 * | 3/2005 | Shibahara et al. | 327/156 |
| 7,301,414 B2 * | 11/2007 | Hino | 331/179 |
| 7,504,894 B2 | 3/2009 | Kawamoto et al. | 331/44 |
| 7,737,792 B2 * | 6/2010 | Kawamoto et al. | 331/10 |
| 2007/0030079 A1 * | 2/2007 | Kawamoto et al. | 331/16 |

FOREIGN PATENT DOCUMENTS

| | | |
|---|---|---|
| JP | 2003-152507 A | 5/2003 |
| JP | 2003-229764 A | 8/2003 |
| JP | 2007-129501 A | 5/2007 |

* cited by examiner

*Primary Examiner* — Patrick O'Neill
(74) *Attorney, Agent, or Firm* — Mattingly & Malur, PC

(57) ABSTRACT

A phase locked loop (PLL) which has a desired frequency characteristic even though a manufacturing process of a semiconductor integrated circuit has fluctuations. The semiconductor integrated circuit includes the PLL and a control unit. The PLL has a phase frequency detector, a loop filter, a voltage controlled oscillator (VCO) and a divider. The VCO comprises a voltage-current converter (VIC) and a ring oscillator. In response to a control voltage, the VIC generates a control current for setting each operating current of the ring oscillator. The control unit switches the PLL to a calibration operating period of its open loop and a normal operating period of its closed loop.

8 Claims, 15 Drawing Sheets

PRIOR ART

PRIOR ART

PHASE LOCKED LOOP

CLAIM OF PRIORITY

The present application claims priority from Japanese patent application JP 2008-303616 filed on Nov. 28, 2008, the content of which is hereby incorporated by reference into this application.

FIELD OF THE INVENTION

The present invention relates to a semiconductor integrated circuit having a PLL built therein, and particularly to a technology useful to provide a PLL able to have a desired frequency characteristic even though a manufacturing process of a semiconductor integrated circuit has some fluctuations.

BACKGROUND OF THE INVENTION

As has been well known, a phase locked loop (PLL) comprises a voltage controlled oscillator (VCO), a phase detector, a loop filter and a divider. An output of the phase detector is supplied to an oscillation control input terminal of the voltage controlled oscillator (VCO) via the loop filter, and a stable reference signal is supplied to one input terminal of the phase detector. On the other hand, an output signal of the voltage controlled oscillator (VCO) is fed back to the other input terminal of the phase detector via the divider. It is thus possible to stabilize the output frequency of the voltage controlled oscillator (VCO) with respect to a change in temperature, a variation with time, a variation in power source, etc. The output signal of the VCO can hence be used as a stable clock signal or the like for a semiconductor integrated circuit.

For example, a PLL built in a semiconductor integrated circuit mounted in a disk recording/reproducing device, which accesses recording media such as hard disk (HDD), a compact disk (CD), a digital video disk (DVD), a blue-ray disk (BD), etc., generates a clock signal for determining an access speed of the recording medium and generates a clock signal for determining a data transfer rate at an interface between a host device such as a personal computer and the semiconductor integrated circuit.

There is thus a need for a calibration function for adjusting the characteristic of the PLL at the time of shipment of the semiconductor integrated circuit or at a calibration operating period or the like just before a normal operation in such a manner that the PLL built in the semiconductor integrated circuit satisfies a desired characteristic.

Particularly in a semiconductor integrated circuit such as an analog-digital mixed-signal processing LSI (hereinafter called "ana-digi mixed LSI") or the like, a voltage controlled oscillator (VCO) corresponding to an analog circuit needs to keep frequency control sensitivity relatively low for the purpose of generating an output signal of a high frequency and reducing frequency jitter.

Further, the general-purpose ana-digi mixed LSI needs to suppress fluctuations in manufacturing process for the purpose of manufacturing it on a mass production line. For example, the ana-digi mixed LSI is equipped with a PLL for the purpose of generating an operation clock for a logic circuit and generating a transmit signal clock. An analog circuit such as a voltage controlled oscillator (VCO) or the like included in this PLL greatly varies in characteristic due to fluctuations in manufacturing process. Particularly, when an operating environment large in temperature change is estimated or considered as in a case where a manufacturing process such as a miniaturizing process or the like fluctuates greatly, a case where the analog circuit is used as an automobile mounting part, etc., there is a case where the voltage controlled oscillator (VCO) or the like included in the PLL cannot satisfy a desired characteristic. Thus, various proposals for bringing the voltage controlled oscillator (VCO) of the PLL to the desired characteristic have heretofore been carried out.

First, a patent document 1 describes that a control voltage for controlling an oscillation frequency of a voltage controlled oscillator (VCO) is supplied to its corresponding gate of a conversion MOS transistor of a voltage-current converter in an operation current control unit, which converts the control voltage to an operating current of a ring oscillator, and a drain current of the conversion MOS transistor is supplied to an input terminal of a current mirror to thereby determine the operating current of the ring oscillator according to the current at an output terminal of the current mirror. A conversion resistor between the source of the conversion MOS transistor and a ground potential can be selected to a low resistance and a high resistance. When the low resistance is selected for the conversion resistor, the operating current of the ring oscillator assumes a large value in response to a predetermined control voltage, so that an oscillation signal of a high frequency can be generated. When the high resistance is selected as for the conversion resistor on the contrary, the operating current of the ring oscillator assumes a small value in response to the predetermined control voltage, so that an oscillation signal of a low frequency can be generated. Further, the patent document 1 also has described that such another resistor that even though the control voltage is zero volt, the operating current of the ring oscillator becomes a micro or minimal value and the ring oscillator oscillates at an extremely low frequency, is coupled between the input terminal of the current mirror of the voltage-current converter and the ground potential.

Even in the case of a patent document 2, a control voltage is supplied to its corresponding gate of a conversion MOS transistor of a voltage-current converter, and a drain current of the conversion MOS transistor is supplied to an input terminal of a current mirror, thereby determining an operating current of a ring oscillator of a voltage controlled oscillator (VCO) according to a current from an output terminal of the current mirror. Further, the patent document 2 describes the solution of a problem that due to a low breakdown voltage of each MOS transistor by a miniaturized manufacturing process, frequency control sensitivity of an oscillation frequency vs control voltage at the conversion MOS transistor of the voltage-current converter for generating the operating current of the ring oscillator increases, so that a jitter characteristic is degraded. In order to solve this problem, the patent document 2 also describes that another current mirror circuit such that even though the control voltage is zero volt, the operating current of the ring oscillator becomes a minimal value and the ring oscillator oscillates at an extremely low frequency, is coupled between an input terminal of the current mirror of the voltage-current converter and a ground potential.

Further, a patent document 3 also describes in a manner similar to the patent document 2 that an offset current addition circuit such that even though a control voltage is zero volt at a voltage controlled oscillator (VCO), an operating current of a ring oscillator becomes a minimal value and the ring oscillator oscillates at an extremely low frequency, is coupled between an input terminal of a current mirror of a voltage-current converter and a ground potential. However, the voltage-current converter described in the patent document 3 is used as a differential voltage-current converter and larger in the number of elements than the voltage-current converter described in the patent document 2.

[Patent Document 1] Japanese Unexamined Patent Publication No. 2003-152507
[Patent Document 2] Japanese Unexamined Patent Publication No. 2007-129501
[Patent Document 3] Japanese Unexamined Patent Publication No. 2003-229764

SUMMARY OF THE INVENTION

Prior to the present invention, the present inventors et al. have been involved in the study and development of a PLL built in a semiconductor integrated circuit mounted to a disk recording/reproducing device.

FIG. 26 is a diagram showing a voltage controlled oscillator (VCO) included in the PLL examined by the present inventors et al. prior to the present invention.

The voltage controlled oscillator (VCO) 5 shown in FIG. 26 comprises a voltage-current converter (VIC) 51 and a current controlled oscillator (CCO) 52. The current controlled oscillator (CCO) 52 configured as a ring oscillator comprises delays 521, 522 and 523 of odd-numbered stages.

An inverse output signal Fvcob and a non-inverse output signal Fvco of the delay 523 of the final stage are respectively supplied to a non-inverse input terminal and an inverse input terminal of the delay 521 of the first stage. An inverse output signal and a non-inverse output signal of the delay 521 are respectively supplied to a non-inverse input terminal and an inverse input terminal of the delay 522 of the next stage. An inverse output signal and a non-inverse output signal of the delay 522 are respectively supplied to a non-inverse input terminal and an inverse input terminal of the delay 523.

When a control voltage (Vc) for controlling an oscillation frequency of the voltage controlled oscillator (VCO) 5 is supplied to its corresponding input terminal of the voltage-current converter (VIC) 51, the voltage-current converter (VIC) 51 executes voltage-current conversion to generate a converted current thereinside. This converted current is converted to an output voltage (Vp) by the voltage-current converter (VIC) 51. The output voltage (Vp) generated from an output terminal of the voltage-current converter (VIC) 51 is supplied to the delays 521, 522 and 523 of the current controlled oscillator (CCO) 52 as a bias voltage so that respective operating currents and delay times of the delays 521, 522 and 523 are set. The oscillation frequency of the voltage controlled oscillator (VCO) 5 is therefore decided.

FIG. 20 is a diagram showing a configuration of each of the delays 521, 522 and 523 of the current controlled oscillator (CCO) 52 in the voltage controlled oscillator (VCO) 5 shown in FIG. 26.

The delay 521 (522, 523) shown in FIG. 20 has a first input terminal i1 and a second input terminal i2 that respectively function as a non-inverse input terminal and an inverse input terminal and has a first output terminal o1 and a second output terminal o2 that respectively function as an inverse output terminal and a non-inverse output terminal.

A gate of a P channel MOS transistor 5212 and a gate of an N channel MOS transistor 5216 are coupled to the first input terminal i1. A drain of the P channel MOS transistor 5212, a drain of the N channel MOS transistor 5216, a drain of a P channel MOS transistor 5213 and a gate of a P channel MOS transistor 5214 are coupled to the first output terminal o1.

A gate of a P channel MOS transistor 5215 and a gate of an N channel MOS transistor 5217 are coupled to the second input terminal i2. A drain of the P channel MOS transistor 5215, a drain of the N channel MOS transistor 5217, a drain of the P channel MOS transistor 5214 and a gate of the P channel MOS transistor 5213 are coupled to the second output terminal o2.

Sources of the two N channel MOS transistors 5216 and 5217 are coupled to aground potential GND. Sources of the four P channel MOS transistors 5212, 5213, 5214 and 5215 are coupled to a source voltage $V_{DD}$ via a drain-source path of a bias P channel MOS transistors 5211. An output voltage (Vp) generated from an output terminal of the voltage-current converter (VIC) 51 of the voltage controlled oscillator (VCO) 5 shown in FIG. 26 is supplied to a gate of the bias P channel MOS transistor 5211. Thus, since the operating currents and delay times of the delays 521, 522 and 523 that configure the current controlled oscillator (CCO) 52 of the voltage controlled oscillator (VCO) 5 shown in FIG. 26 are set, the oscillation frequency of the voltage controlled oscillator (VCO) 5 is determined.

FIG. 27 is a diagram showing a configuration of the voltage-current converter (VIC) 51 of the voltage controlled oscillator (VCO) 5 shown in FIG. 26.

The voltage-current converter (VIC) 51 shown in FIG. 27 comprises an N channel MOS transistor 511 that functions as a voltage-current conversion element and a P channel MOD transistor 512 that functions as a current-voltage conversion element. A converted current (Ip) is generated from a drain of the N channel MOS transistor 511 in response to the control voltage (Vc) supplied to its corresponding gate of the N channel MOS transistor 511 whose source is coupled to the ground potential GND. The generated converted current is supplied to the P channel MOS transistor 512. Since a gate and a drain of the P channel MOS transistor 512 whose source is coupled to the source voltage $V_{DD}$ are coupled to each other, the P channel MOS transistor 512 operates as a diode. Thus, the converted current (Ip) from the drain of the N channel MOS transistor 511 is converted to an output voltage (Vp) by the P channel MOS transistor 512 used as the diode.

The output voltage (Vp) generated at both ends of the P channel MOS transistor 512 of the voltage-current converter (VIC) 51 shown in FIG. 27 is supplied between the source and gate of the bias P channel MOS transistor 5211 lying inside the delay 521 (522, 523) shown in FIG. 20. Thus, since the operating currents and delay times of the delays 521, 522 and 523 that configure the current controlled oscillator (CCO) 52 of the voltage controlled oscillator (VCO) 5 shown in FIG. 26 are set, the oscillation frequency of the voltage controlled oscillator (VCO) 5 is determined.

FIG. 28 is a diagram showing the characteristics of frequency control sensitivity of oscillation frequency vs control voltages of the voltage controlled oscillator (VCO) 5 shown in FIG. 26, which has been examined by the present inventors et al. prior to the present invention. The vertical axis of FIG. 28 indicates the frequency of an oscillation output signal Fvco, and the horizontal axis of FIG. 28 indicates the level of a control voltage Vc supplied to the voltage-current converter (VIC) 51.

FIG. 28 shows a characteristic where the voltage controlled oscillator (VCO) 5 shown in FIG. 26 is manufactured in a non-miniaturized CMOS manufacturing process at which the minimum line width is 0.18 μm, and a characteristic where the voltage controlled oscillator (VCO) 5 shown in FIG. 26 is manufactured in a miniaturized CMOS manufacturing process at which the minimum line width is 45 nm.

Assume that in the 0.18 μm non-miniaturized CMOS manufacturing process, for example, the source voltage $V_{DD}$ is 1.8V and the threshold voltage of the N channel MOS transistor 511 corresponding to the voltage-current conversion element of the voltage-current converter (VIC) 51 shown in FIG. 27 is a relatively large value Vth180. When an output frequency (Fo) of the PLL and a control voltage Vc placed in a locked state of the PLL are set after doing so, frequency control sensitivity Kv180 of an oscillation frequency vs control voltage is determined. Assuming that in the example shown in FIG. 28, the control voltage Vc in the locked state is 1.3V, for example, the frequency control sensitivity (Kv180) becomes a relatively small value of Kv=Fo/(1.3V−Vth180).

On the other hand, in the miniaturized CMOS manufacturing process at which the minimum line width is 45 nm, the source voltage $V_{DD}$ is assumed to be 1.0V for example and the threshold voltage of the N channel MOS transistor 511 corresponding to the voltage-current conversion element of the voltage-current converter (VIC) 51 shown in FIG. 27 is assumed to be a relatively small value Vth45. Assuming that the voltage corresponding to the control voltage Vc placed in the locked state of the PLL is 0.7V, for example, the frequency control sensitivity (Kv45) becomes a relatively large value of Kv=Fo/(0.7−Vth45).

Thus, there is a tendency that the frequency control sensitivity Kv increases due to the low threshold voltage and the low source voltage according to the miniaturized CMOS manufacturing process. A problem, however, arises in that since the oscillation output frequency of the voltage controlled oscillator (VCO) fluctuates greatly due to noise contained in the control voltage Vc where the value of the frequency control sensitivity Kv is extremely high, a satisfactory jitter characteristic is not obtained.

When the frequency control sensitivity Kv increases due to the miniaturized CMOS manufacturing process, the frequency band of the PLL is brought to band widening correspondingly. Although there is, however, a need to limit the frequency band of the PLL to a certain degree of range in order to meet noise spectra and other characteristics defined by various standards or the like of electronic equipment, there is a tendency that it becomes difficult to comply with the various standards due to the band widening of the PLL based on the miniaturized CMOS manufacturing process.

Further, there has also been revealed a problem that fluctuations in the frequency characteristic of the PLL such as the frequency control sensitivity Kv or the like also become large due to the fact that relative fluctuations in the threshold voltage become large with a decrease in the threshold voltage of a miniaturize MOS transistor of a semiconductor integrated circuit.

On the other hand, in the PLL, the output of a phase frequency detector is supplied to its corresponding input of a charge pump, and a loop filter for generating the control voltage Vc for controlling the oscillation frequency of the voltage controlled oscillator (VCO) is driven by charging/discharging of the output of the charge pump. It has, however, also been revealed by examinations of the present inventors et al. that the characteristic of the charge pump is also affected by the miniaturized CMOS manufacturing process.

FIG. 29 is a diagram showing a configuration of a charge pump examined by the present inventors et al. prior to the present invention.

The charge pump 2 shown in FIG. 29 comprises a current source 25 for generating a charging current, a P channel MOS transistor 26 driven by an up output UP of a phase frequency detector, an N channel MOS transistor 27 driven by a down output DN of the phase frequency detector, and a current source 28 for generating a discharging current.

Constant currents of the charging current source 25 and the discharging current source 28 are assumed to be Icp. The on resistance and threshold voltage of a P channel MOS transistor of the charging current source 25 are respectively assumed to be Ronp and Vthp. The on resistance and threshold voltage of an N channel MOS transistor of the discharging current source 28 are respectively assumed to be Ronn and Vthn.

A control voltage Vc of the loop filter for controlling the oscillation frequency of the voltage controlled oscillator (VCO) is generated from an output terminal to which the drain of the P channel MOS transistor 26 of the charge pump 2 and the drain of the N channel MOS transistor 27 thereof are coupled. An operation range in which the charging current source 25 and the discharging current source 28 of the charge pump 2 cause a predetermined constant current Icp to flow therethrough, is limited as follows.

FIG. 30 is a diagram showing the relationship between the current Icp flowing through the charging current source 25 and the discharging current source 28 at the charge pump 2 shown in FIG. 29 and the control voltage Vc at the output terminal of the charge pump 2.

The value of the control voltage Vc corresponds to approximately half the source voltage $V_{DD}$ approximately in the central part of FIG. 30. The P channel MOS transistor of the charging current source 25 and the N channel MOS transistor of the discharging current source 28 respectively operate in a saturated region. Thus, the P channel MOS transistor of the charging current source 25 and the N channel MOS transistor of the discharging current source 28 allow predetermined constant currents Icp to flow therethrough respectively approximately in the central part of FIG. 30.

When, however, the control voltage Vc of the output terminal of the charge pump 2 is reduced and becomes lower than a level of Vthn+Icp*Ronn, the N channel MOS transistor of the discharging current source 28 operates in a linear region. Thus, since the drain current of the N channel MOS transistor of the discharging current source 28 is reduced in proportion to a low drain-source voltage, the charging current of the N channel MOS transistor of the discharging current source 28 becomes a value smaller than the predetermined constant current Icp.

On the other hand, when the control voltage Vc of the output terminal of the charge pump 2 rises and the control voltage Vc becomes higher than a level of $V_{DD}$−Vthp−Icp*Ronp, the P channel MOS transistor of the charging current source 25 operates in a linear region. Thus, since the drain current of the P channel MOS transistor of the charging current source 25 is reduced in proportion to a low source-drain voltage, the discharging current of the P channel MOS transistor of the charging current source 25 becomes a value smaller than the predetermined constant current Icp.

Thus, as compared with the frequency control sensitivity of the voltage controlled oscillator (VCO) where the control voltage Vc of the output terminal of the charge pump 2 changes at each of the right and left parts of FIG. 30, the value of the frequency control sensitivity of the voltage controlled oscillator (VCO) where the control voltage Vc changes approximately in the central part of FIG. 30 becomes high.

Accordingly, it has been revealed by examinations of the present inventors et al. that it is necessary to consider the jitter characteristic of the voltage controlled oscillator (VCO) in the PLL in consideration of an increase in the frequency control sensitivity Kv due to the miniaturized CMOS manufacturing process shown in FIG. 28 and an increase in the frequency control sensitivity Kv in a region in which the control voltage Vc corresponding to the output of the charge pump 2, which has been shown approximately in the central part of FIG. 30, is relatively high.

The present invention has been made as a result of the above examinations of the present inventors et al. prior to the present invention.

Accordingly, an object of the present invention is to provide a PLL able to have a desired frequency characteristic even though a manufacturing process of a semiconductor integrated circuit has some fluctuations.

Further, another object of the present invention is to set frequency control sensitivity of a voltage controlled oscillator of a PLL to a desired characteristic.

A further object of the present invention is to improve a jitter characteristic of a voltage controlled oscillator of a PLL.

The above, other objects and novel features of the present invention will become apparent from the description of the present specification and the accompanying drawings.

A typical one of the inventions disclosed in the present application will be explained in brief as follows:

A typical semiconductor integrated circuit of the present invention comprises a phase locked loop (PLL) and a control unit (9).

The phase locked loop comprises a phase frequency detector (1), a loop filter (3), a voltage controlled oscillator (8) and a divider (6).

The voltage controlled oscillator (8) comprises a voltage-current converter (81) and a ring oscillator (52) (refer to FIG. 2).

The ring oscillator (52) has delays (521, 522 and 523) of odd-numbered stages (refer to FIG. 2).

The voltage-current converter (81) generates a control current (Ip) in response to the control voltage (Vc) (refer to FIG. 3) and causes the control current (Ip) to set respective operating currents of the delays of the ring oscillator (52) (refer to FIG. 2).

The control unit (9) switches the phase locked loop (PLL) to a calibration operating period and a normal operating period.

During the normal operating period, the phase locked loop (PLL) is controlled to a closed loop by the control unit (9), whereas during the calibration operating period, the phase locked loop (PLL) is controlled to an open loop by the control unit (9).

During the normal operating period, the frequency of the oscillation output signal of the voltage controlled oscillator is brought to a predetermined frequency (B) determined by the frequency of the reference signal (Fref) and a division ratio of the divider (6).

During the calibration operating period, the measurement of the frequency of the oscillation output signal (Fvco) of the voltage controlled oscillator (8) in a state in which a reference voltage ($V_{REF}$) of a level approximately equal to the control voltage (Vc) of the predetermined level is being supplied to its corresponding control input of the voltage controlled oscillator (8), is executed by the control unit (9) (refer to FIGS. 5 and 7).

The control unit (9) sets the value of a first operation parameter (T) of the voltage-current converter (81) of the voltage controlled oscillator (8) in such a manner that the frequency of the oscillation output signal of the voltage controlled oscillator in the state in which the reference voltage has been supplied to the voltage controlled oscillator becomes approximately equal to the predetermined frequency (B) during the execution of the measurement of the frequency (refer to Steps 56 through 59 of FIG. 5).

An advantageous effect obtained by a typical one of the inventions disclosed in the present application will be explained in brief as follows:

There can be provided a PLL able to have a desired frequency characteristic even though a manufacturing process of a semiconductor integrated circuit has some fluctuations.

BRIEF DESCRIPTION OF THE DRAWINGS

FIG. 31 is a diagram illustrating a configuration of a PLL built in a semiconductor integrated circuit according to a seventh embodiment of the present invention;

FIG. 32 is a diagram for describing an operation of the voltage-current converter shown in FIG. 3;

FIG. 33 is a diagram for describing an operation of the voltage-current converter shown in FIG. 3;

FIG. 34 is a diagram showing a frequency characteristic L1 of the voltage controlled oscillator examined prior to the present invention by the present inventors et al., which includes the voltage-current converter of FIG. 27 and has been shown in FIG. 26, and a frequency characteristic L2 of the voltage controlled oscillator according to the first embodiment of the present invention, which has been described in FIGS. 1 through 7 and FIGS. 32 and 33; and FIG. 35 is a diagram showing the dependence of a control current Ip flowing through a P channel MOS transistor $81p5$ on a control voltage Vc at the voltage-current converter shown in FIG. 14.

DETAILED DESCRIPTION OF THE PREFERRED EMBODIMENTS

Typical Embodiments

Figure 1:
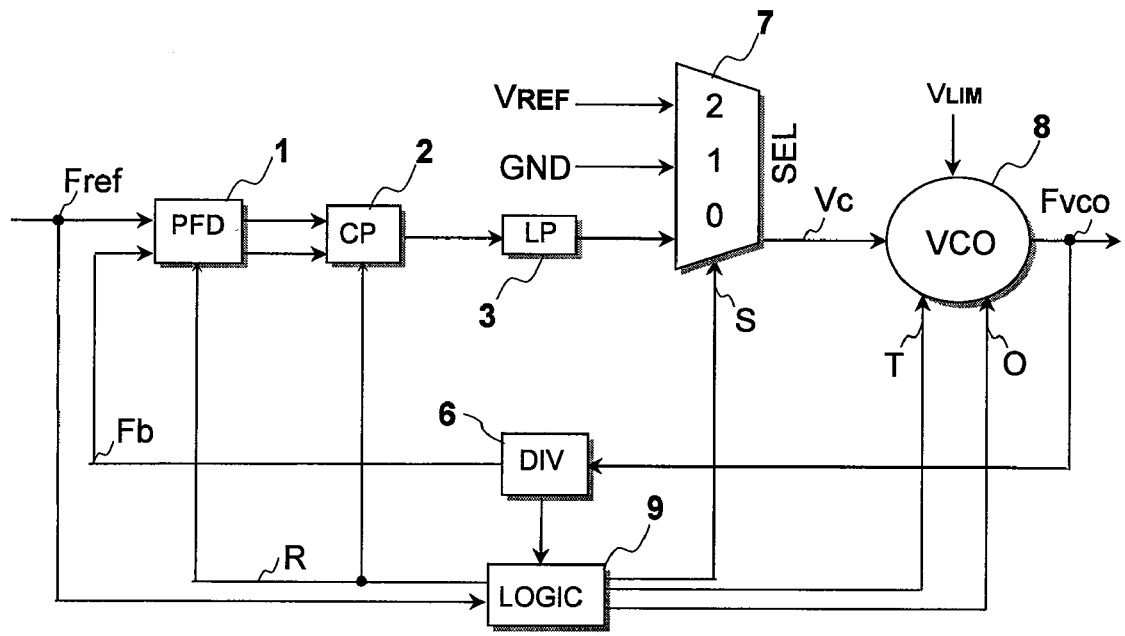
FIG. 1 is a diagram for describing an overall configuration of a PLL built in a semiconductor integrated circuit according to a first embodiment of the present invention.

A summary of typical embodiments of the invention disclosed in the present application will first be explained. Reference numerals of the accompanying drawings referred to with parentheses in the description of the summary of the typical embodiments only illustrate elements included in the concept of components to which the reference numerals are given.

[1] A semiconductor integrated circuit according to a typical embodiment of the present invention comprises a phase locked loop (PLL) and a control unit (9).

The phase locked loop comprises a phase frequency detector (1), a loop filter (3), a voltage controlled oscillator (8) and a divider (6).

A reference signal (Fref) and a feedback signal (Fb) outputted from the divider (6) can respectively be supplied to one input terminal of the phase frequency detector (1) and the other input terminal thereof.

An output of the phase frequency detector (1) is supplied to a control input of the voltage controlled oscillator (8) via the loop filter (3). An oscillation output signal (Fvco) of the output of the voltage controlled oscillator (8) is supplied to the input of the divider (6). The frequency of the oscillation output signal (Fvco) of the voltage controlled oscillator (8) can be controlled in response to a control voltage (Vc) supplied to the control input (refer to FIG. 1).

Figure 2:
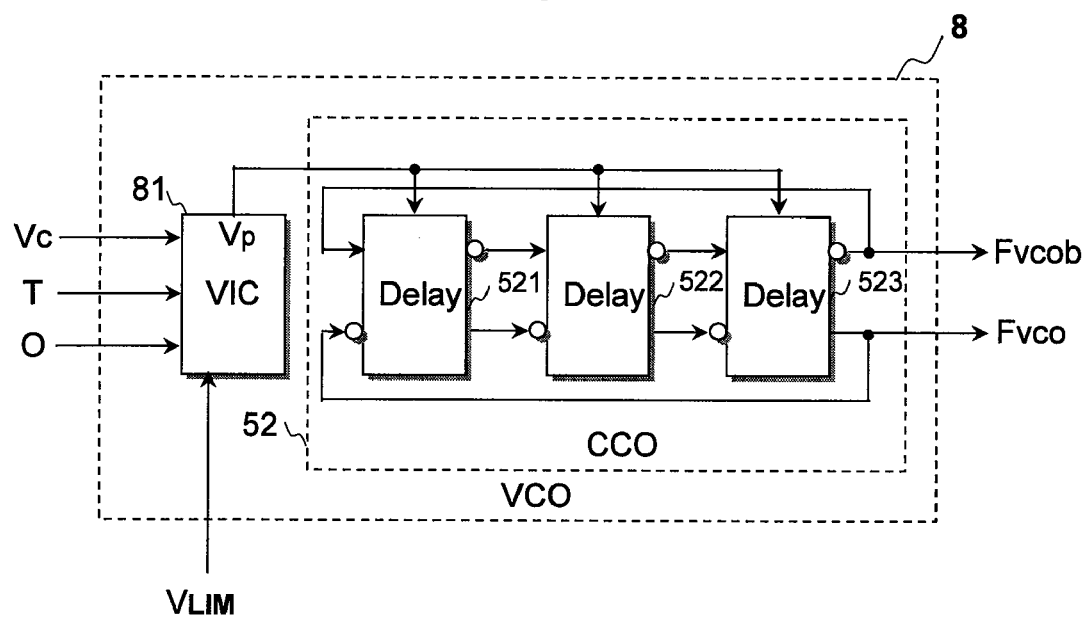
FIG. 2 is a diagram showing a configuration of a voltage controlled oscillator included in the PLL according to the first embodiment of the present invention shown in FIG. 1.

The voltage controlled oscillator (8) comprises a voltage-current converter (81) and a ring oscillator (52) (refer to FIG. 2).

The ring oscillator (52) has delays (521, 522 and 523) of odd-numbered stages (refer to FIG. 2).

The voltage-current converter (81) generates a control current (Ip) in response to the control voltage (Vc) (refer to FIG. 3) and causes the control current (Ip) to set respective operating currents of the delays of the ring oscillator (52) (refer to FIG. 2).

The control unit (9) is capable of switching the phase locked loop (PLL) to a calibration operating period and a normal operating period.

During the normal operating period, the phase locked loop (PLL) is controlled to a closed loop by the control unit (9), whereas during the calibration operating period, the phase locked loop (PLL) is controlled to an open loop by the control unit (9).

During the normal operating period, the output of the phase frequency detector (1) is supplied via the loop filter (3) to the control input of the voltage controlled oscillator (8) as the control voltage (Vc) having a predetermined level at the phase locked loop (PLL) controlled to the closed loop, so that the frequency of the oscillation output signal of the voltage controlled oscillator is brought to a predetermined frequency (B) decided by the frequency of the reference signal (Fref) and a division ratio of the divider (6).

Figure 5:
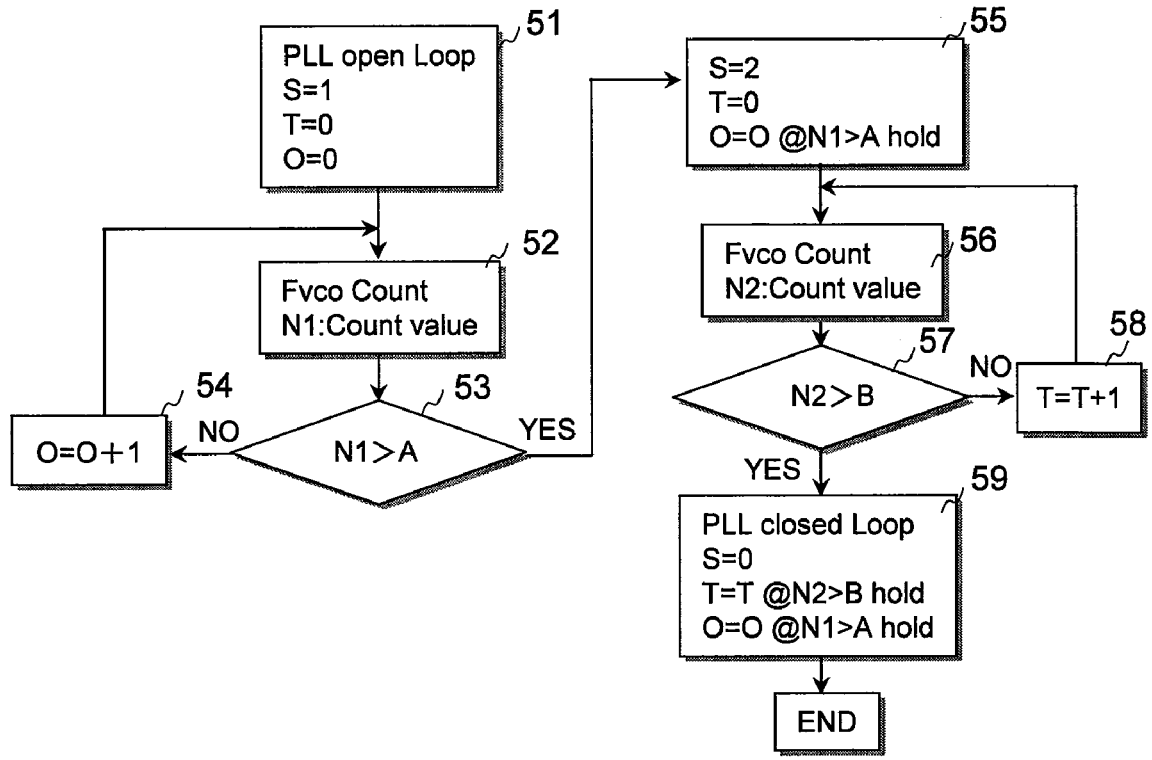
FIG. 5 is a diagram for describing a calibration operation of the PLL according to the first embodiment of the present invention shown in FIG. 1.
Figure 7:
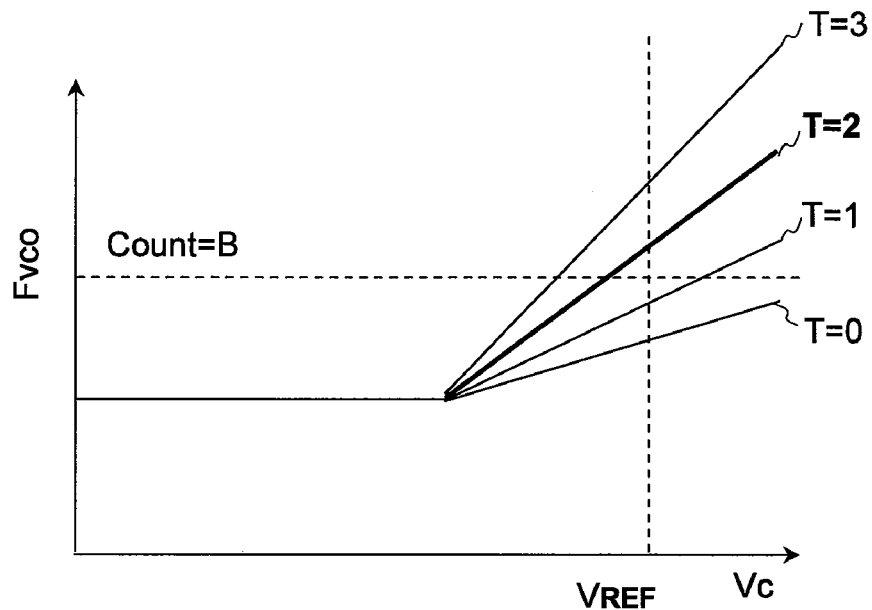
FIG. 7 is a diagram illustrating the manner in which the frequency of a signal outputted from the voltage controlled oscillator increases in response to the updating of a frequency control sensitivity adjustment signal in the calibration operation of the PLL according to the first embodiment of the present invention shown in FIG. 1.

During the calibration operating period, the measurement of the frequency of the oscillation output signal (Fvco) of the voltage controlled oscillator (8) in a state in which a reference voltage ($V_{REF}$) of a level approximately equal to the control voltage (Vc) of the predetermined level has been supplied to the control input of the voltage controlled oscillator (8) at the phase locked loop (PLL) controlled to the open loop, is executed by the control unit (9)(refer to FIGS. 5 and 7).

The control unit (9) sets the value of a first operation parameter (T) of the voltage-current converter (81) of the voltage controlled oscillator (8) in such a manner that the frequency of the oscillation output signal of the voltage controlled oscillator in the state in which the reference voltage has been supplied to the voltage controlled oscillator becomes approximately equal to the predetermined frequency (B) during the execution of the measurement of the frequency (refer to Steps 56 through 59 of FIG. 5).

According to the embodiment, a reference voltage of a level approximately equal to a control voltage of a predetermined level at which an oscillation output signal of a predetermined frequency is generated from a voltage controlled oscillator during a normal operating period of PLL, is supplied to the voltage controlled oscillator during a calibration operating period. While the measurement of the frequency of the oscillation output signal of the voltage controlled oscillator during the calibration operating period is being performed, a control unit sets the value of a first operation parameter of a voltage-current converter of the voltage controller oscillator in such a manner that the frequency of the oscillation output signal of the voltage controlled oscillator supplied with the reference voltage becomes approximately equal to a predetermined frequency.

Thus, according to the embodiment, there can be provided a PLL able to have a desired frequency characteristic even though the manufacturing process of the semiconductor integrated circuit has some variations.

In a semiconductor integrated circuit according to a preferred embodiment, the phase locked loop (PLL) further comprises a selector (7) controlled by the control unit (9).

The selector (7) selects the control voltage (Vc) of the predetermined level during the normal operating period. On the other hand, the selector (7) selects the reference voltage ($V_{REF}$) during the calibration operating period and supplies the selected voltage to the control input of the voltage controlled oscillator (8) (refer to FIG. 1).

In another preferred embodiment, during the calibration operating period, the measurement of the frequency of the oscillation output signal (Fvco) of the voltage controlled oscillator (8) lying in the state in which the control voltage (Vc) having a level of a ground potential (GND) is supplied to the control input of the voltage controlled oscillator (8) of the phase locked loop (PLL) controlled to the open loop, is executed by the control unit (9) prior to the value of the first operation parameter (T) of the voltage-current converter (81) being set (refer to FIGS. 5 and 7).

During the calibration operating period, the control unit (9) sets the value of a second operation parameter (O) of the voltage-current converter (81) of the voltage controlled oscillator (8) prior to the setting of the value of the first operation parameter (T) of the voltage-current converter (81) in such a manner that the frequency of the oscillation output signal in the state in which the control voltage (Vc) having the level of the ground potential (GND) has been supplied to the voltage controlled oscillator becomes approximately equal to a predetermined offset frequency (A) during the execution of the measurement (refer to Steps 52 through 54 of FIG. 5).

In a further preferred embodiment, the selector (7) supplies the control voltage (Vc) having the level of the ground potential (GND) to the control input of the voltage controlled oscillator (8) of the phase locked loop (PLL) controlled to the open loop, prior to the setting of the value of the first operation parameter (T) of the voltage-current converter (81) during the calibration operating period (refer to FIG. 1).

Figure 8:
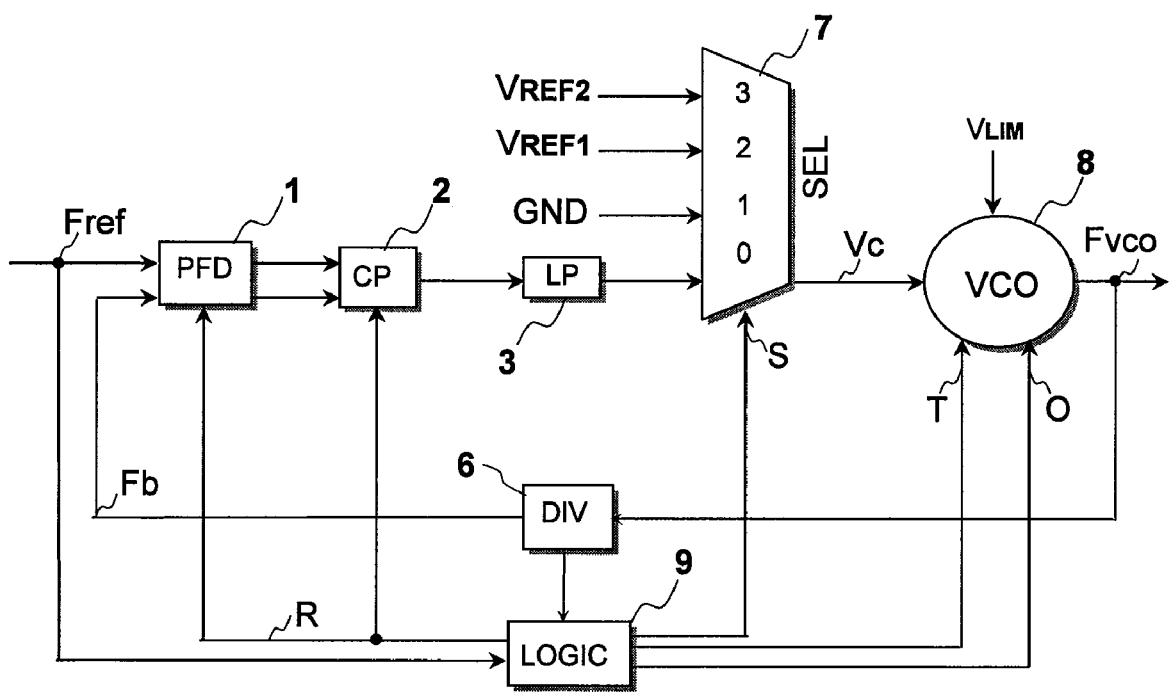
FIG. 8 is a diagram showing a configuration of a PLL built in a semiconductor integrated circuit according to a second embodiment of the present invention.
Figure 9:
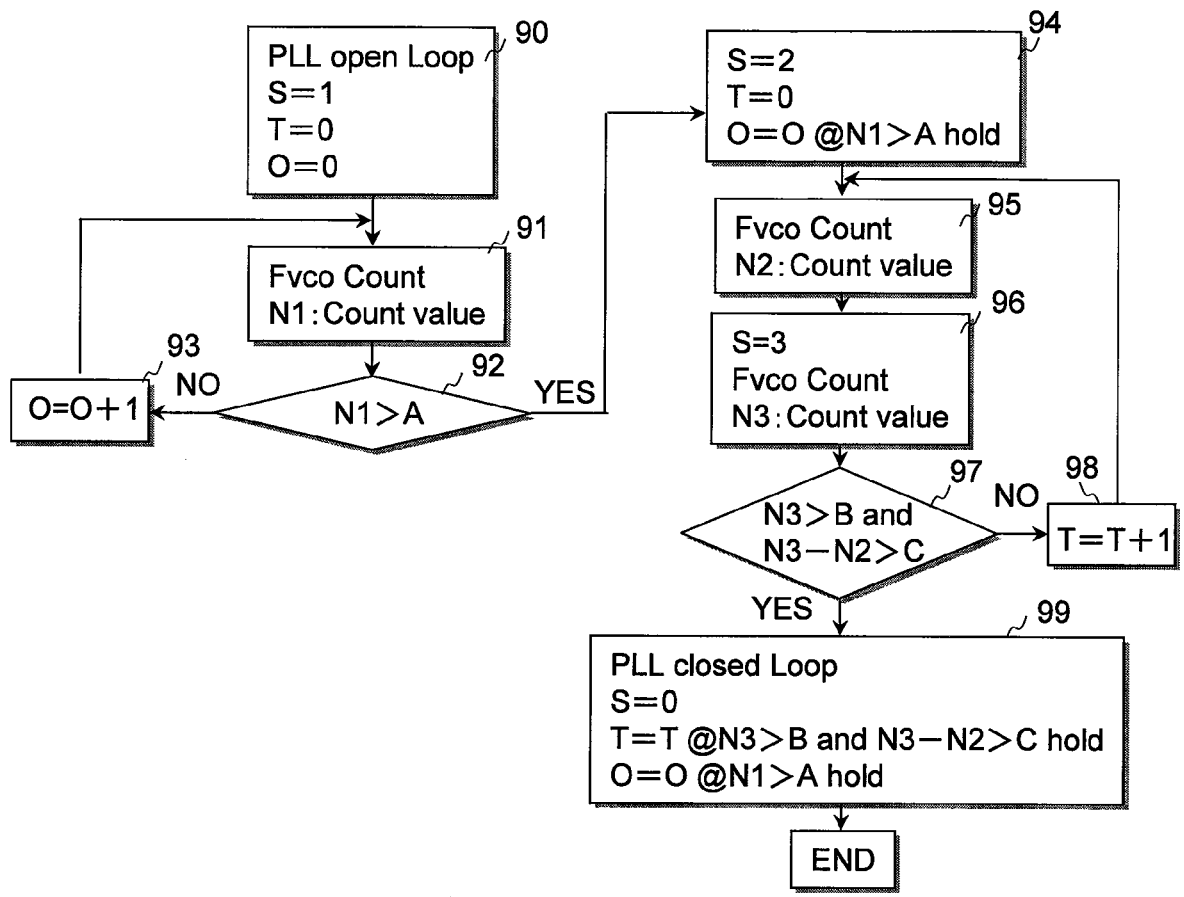
FIG. 9 is a diagram for describing a calibration operation of the PLL according to the second embodiment of the present invention shown in FIG. 8.

In yet another preferred embodiment, after the value of the second operation parameter (O) of the voltage-current converter (81) of the voltage controlled oscillator (8) has been set during the calibration operating period, another measurement (FIG. 9: Steps 94 and 95) of the frequency of the oscillation output signal (Fvco) of the voltage controlled oscillator (8) in the state in which another reference voltage ($V_{REF1}$) of a level higher than the level of the ground potential (GND) and lower than the control voltage (Vc) of the predetermined level has been supplied to the control input of the voltage controlled oscillator (8) of the phase locked loop (PLL) controlled to the open loop, is further executed by the control unit (9) (refer to FIGS. 8, 9, 10 and 11).

During the calibration operating period, the control unit (9) sets the value of the first operation parameter (T) of the voltage-current converter (81) of the voltage controlled oscillator (8) in such a manner that the frequency of the oscillation output signal in the state in which the other reference voltage ($V_{REF1}$) referred to above has been supplied to the voltage controlled oscillator, becomes approximately equal to another predetermined frequency (B−C) lower than the predetermined frequency (B) during the execution of another measurement (refer to Steps 95 through 99 of FIG. 9).

In a still further preferred embodiment, after the value of the second operation parameter (O) has been set during the calibration operating period, the selector (7) supplies the other reference voltage ($V_{REF1}$) to the control input of the voltage controlled oscillator (8) of the phase locked loop (PLL) controlled to the open loop (refer to FIG. 8).

In a semiconductor integrated circuit according to a specific embodiment, the phase locked loop (PLL) further comprises a charge pump (2) which charges/discharges the loop filter (3) in response to the output of the phase frequency detector (1) (refer to FIG. 1).

In a more specific embodiment, the charge pump comprises a first charge pump (2a) and a second charge pump (2b).

The first charge pump (2a) and the second charge pump (2b) are driven in antiphase to each other in response to an up output signal (UP) and a down output signal (DN) each used as the output of the phase frequency detector (1) so that a first charge/discharge current (i1) of the first charge pump (2a) and a second charge/discharge current (i2) of the second charge pump (2b) are respectively set to a predetermined ratio (β).

The loop filter (3) comprises a resistor (R1) and a capacitor (C1) for determining a zero point frequency (f1). One end of the resistor (R1) is coupled to an input terminal of the loop filter (3), and the other end thereof is coupled to a ground potential (GND) via the capacitor (C1).

The one and other ends of the resistor (R1) of the loop filter (3) are respectively driven by the first charge/discharge current (i1) of the first charge pump (2a) and the second charge/discharge current (i2) of the second charge pump (2b).

The resistor (R1) and the capacitor (C1) of the loop filter (3) are built in a semiconductor chip (refer to FIG. 31).

A semiconductor integrated circuit according to a still more specific embodiment can be coupled between a pickup for performing data reading and writing of a disk used as a storage media of a disk recording/reproducing device, and a host computer.

The semiconductor integrated circuit comprises a host interface (2411, 2511) which supplies read data to the host computer and is supplied with write data from the host computer.

Figure 24:
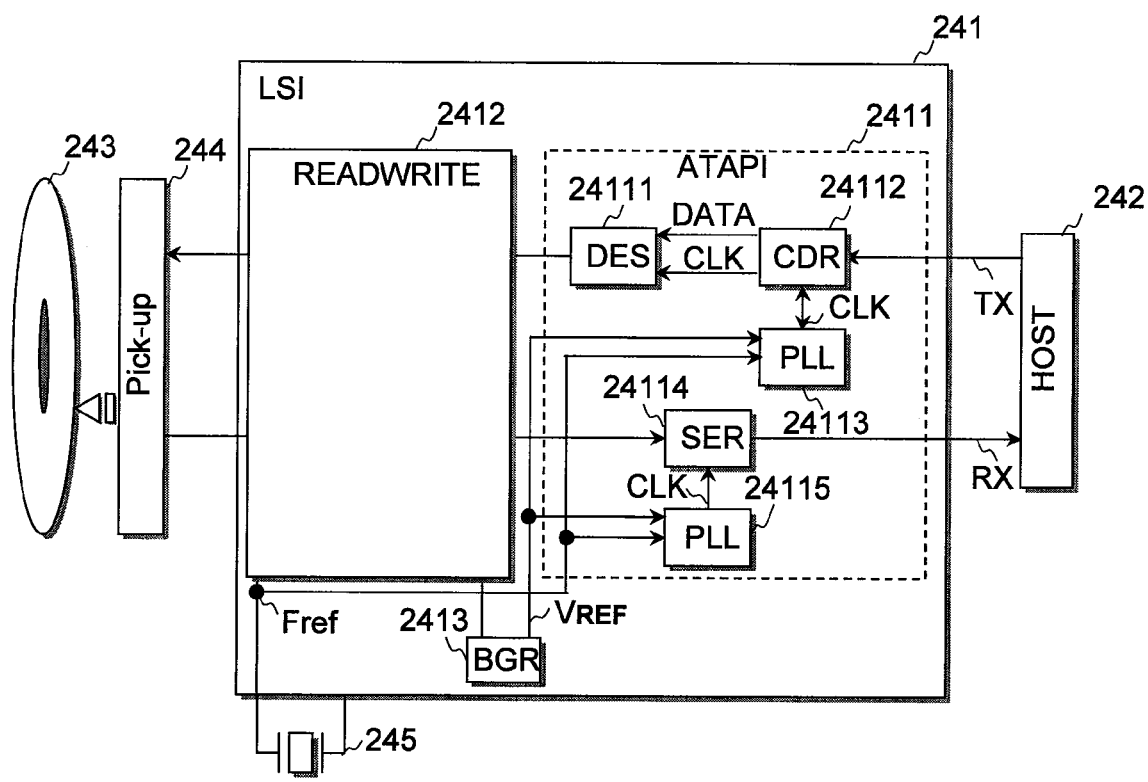
FIG. 24 is a diagram showing a configuration of an optical disk apparatus equipped with a semiconductor integrated circuit according to an eighth embodiment of the present invention.
Figure 25:
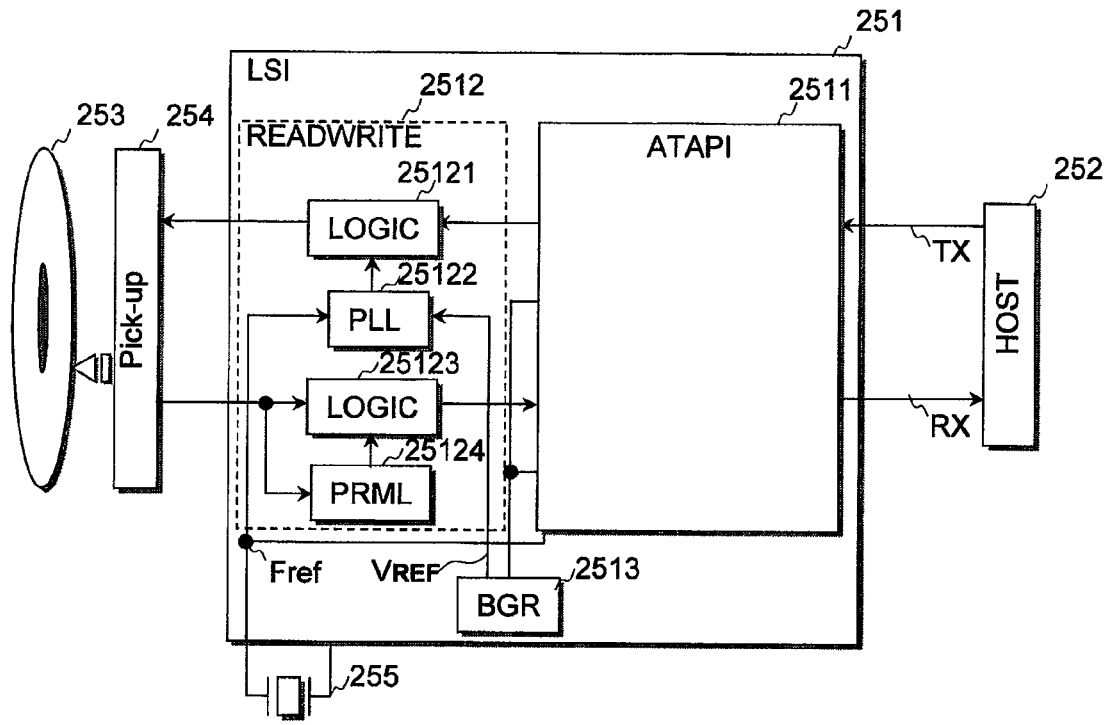
FIG. 25 is a diagram illustrating a configuration of an optical disk apparatus equipped with a semiconductor integrated circuit according to a ninth embodiment of the present invention.

The semiconductor integrated circuit comprises a signal processing unit (2412, 2512) which performs the processing of a signal read from the pickup and performs the processing of a signal written into the pickup (refer to FIGS. 24 and 25).

The phase locked loop (PLL) generates a clock signal used in at least one of the host interface and the signal processing unit.

In the most specific embodiment, the host interface (2411, 2511) is an ATA interface.

[2] A semiconductor integrated circuit according to a typical embodiment of another aspect of the present invention comprises a phase locked loop (PLL) and a control unit (9).

The phase locked loop comprises a phase frequency detector (1), a loop filter (3), a voltage controlled oscillator (8) and a divider (6).

A reference signal (Fref) and a feedback signal (Fb) outputted from the divider (6) can respectively be supplied to one input terminal of the phase frequency detector (1) and the other input terminal thereof.

An output of the phase frequency detector (1) is supplied to a control input of the voltage controlled oscillator (8) via the loop filter (3). An oscillation output signal (Fvco) of an output of the voltage controlled oscillator (8) is supplied to the input of the divider (6). The frequency of the oscillation output signal (Fvco) of the voltage controlled oscillator (8) can be controlled in response to a control voltage (Vc) supplied to the control input (refer to FIG. 12).

Figure 13:
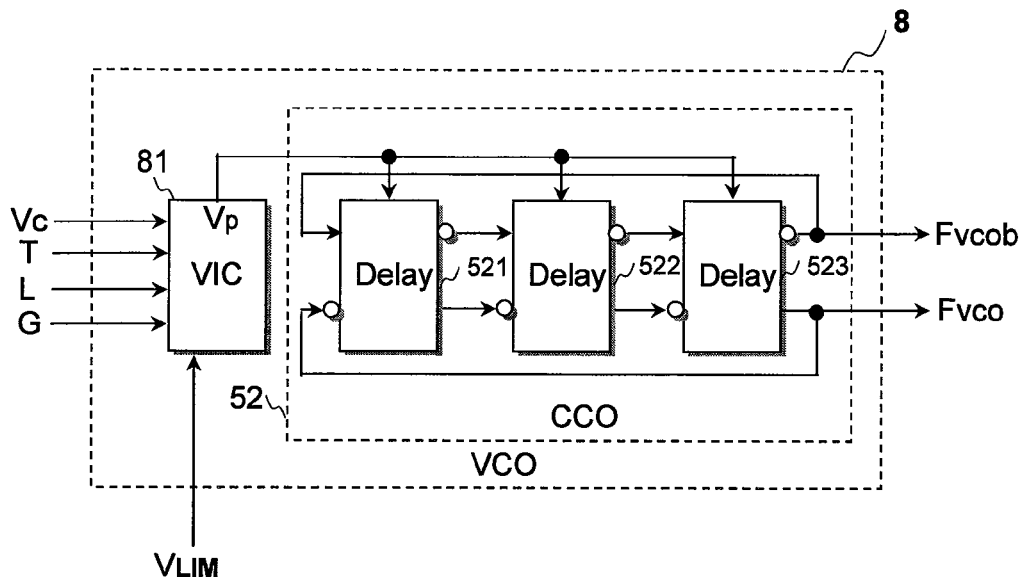
FIG. 13 is a diagram showing a configuration of a voltage controlled oscillator included in the PLL according to the third embodiment of the present invention shown in FIG. 12.

The voltage controlled oscillator (8) comprises a voltage-current converter (81) and a ring oscillator (52) (refer to FIG. 13).

The ring oscillator (52) has delays (521, 522 and 523) of odd-numbered stages (refer to FIG. 13).

The voltage-current converter (81) generates a control current (Ip) in response to the control voltage (Vc) (refer to FIG. 14) and causes the control current (Ip) to set respective operating currents of the delays of the ring oscillator (52) (refer to FIG. 13).

The control unit (9) is capable of switching the phase locked loop (PLL) to a calibration operating period and a normal operating period.

During the normal operating period, the phase locked loop (PLL) is controlled to a closed loop by the control unit (9), whereas during the calibration operating period, the phase locked loop (PLL) is controlled to an open loop by the control unit (9).

During the normal operating period, the output of the phase frequency detector (1) is supplied via the loop filter (3) to the control input of the voltage controlled oscillator (8) as the control voltage (Vc) having a predetermined level at the phase locked loop (PLL) controlled to the closed loop, so that the frequency of the oscillation output signal of the voltage controlled oscillator is brought to a predetermined frequency (B) decided by the frequency of the reference signal (Fref) and a division ratio of the divider (6).

Figure 15:
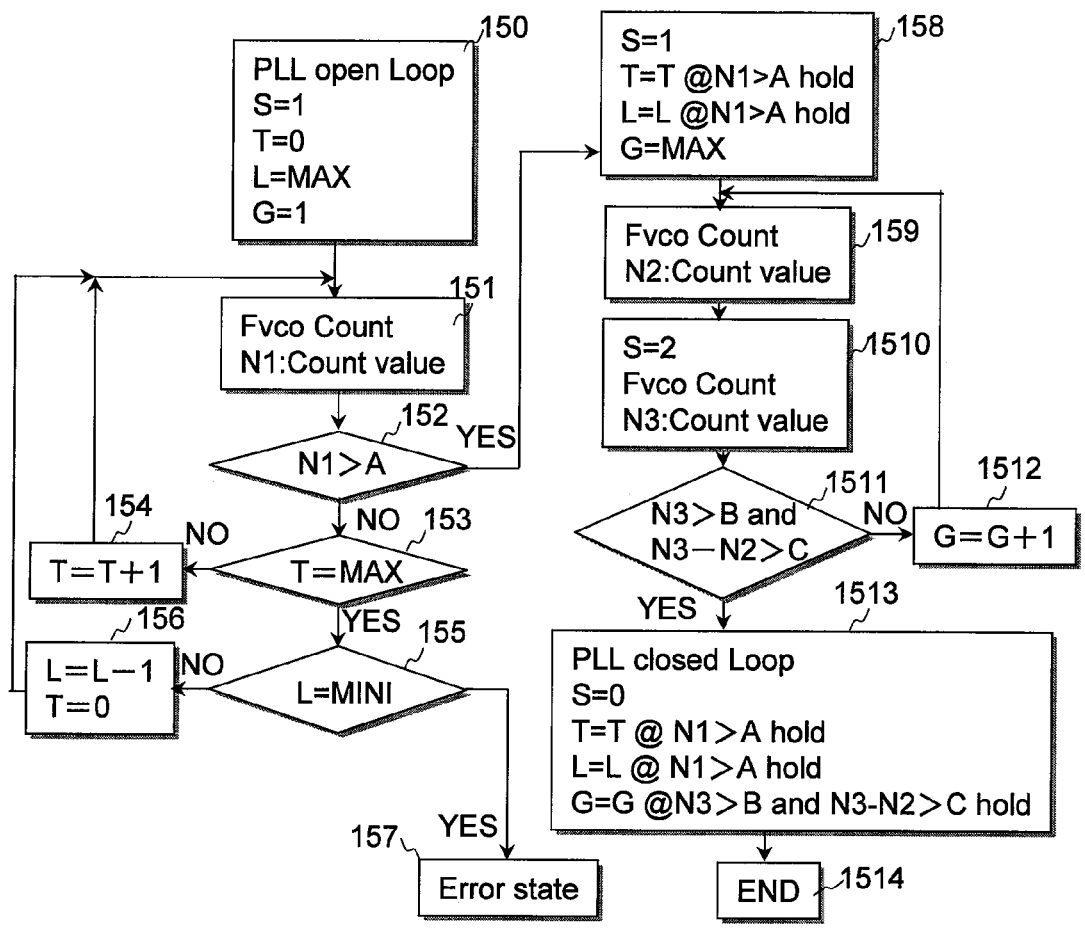
FIG. 15 is a diagram for describing a calibration operation of the PLL according to the third embodiment of the present invention shown in FIGS. 12 through 14.
Figure 16:
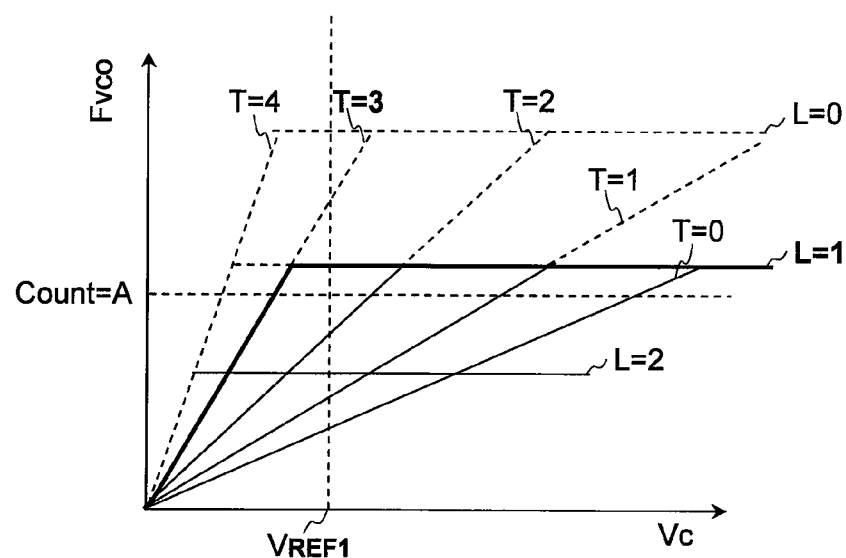
FIG. 16 is a diagram showing the manner in which the oscillation frequency of a signal outputted from the voltage controlled oscillator increases in response to the updating of an adjustment signal T and an adjustment signal L and the updating of an adjustment signal T and an adjustment signal L in the calibration operation of the PLL according to the third embodiment of the present invention shown in FIGS. 12 through 15.

During the calibration operating period, a first measurement of the frequency of the oscillation output signal (Fvco) of the voltage controlled oscillator (8) in a state in which a first reference voltage ($V_{REF1}$) of a level higher than a ground potential (GND) and low relatively is being supplied to the control input of the voltage controlled oscillator (8), is executed by the control unit (9) at the phase locked loop (PLL) controlled to the open loop (refer to FIGS. 15 and 16).

The control unit (9) sets the value of a first operation parameter (T, L) of the voltage-current converter (81) of the voltage controlled oscillator (8) in such a manner that the frequency of the oscillation output signal of the voltage controlled oscillator in the state in which the first reference voltage ($V_{REF1}$) has been supplied to the voltage controlled oscillator becomes approximately equal to the first predetermined frequency (A) during the execution of the first measurement of the frequency (refer to Steps 150 through 158 of FIG. 15).

Figure 17:
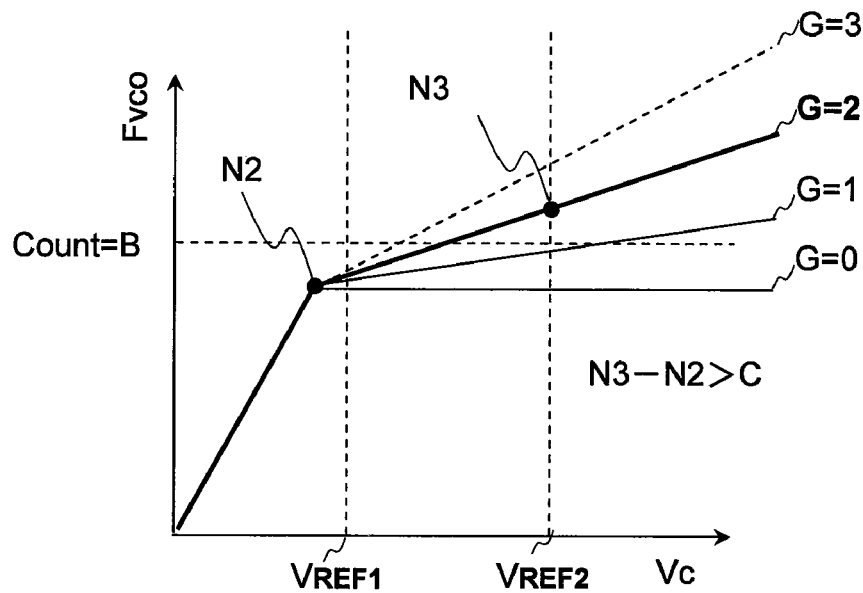
FIG. 17 is a diagram illustrating the manner in which the frequency of a signal outputted from the voltage controlled oscillator increases in response to the updating of an adjustment signal G in the calibration operation of the PLL according to the third embodiment of the present invention shown in FIGS. 12 through 16.

During the calibration operating period, a second measurement of the frequency of the oscillation output signal (Fvco) of the voltage controlled oscillator (8) in a state in which a second reference voltage ($V_{REF2}$) of a level higher than the first reference voltage ($V_{REF1}$) and approximately equal to the control voltage (Vc) of the predetermined level is being supplied to the control input of the voltage controlled oscillator (8), is executed by the control unit (9) after the setting of the value of the first operation parameter (T, L) of the voltage-current converter (81) (refer to FIGS. 15 and 17).

The control unit (9) sets the value of the second operation parameter (G) of the voltage-current converter (81) of the voltage controlled oscillator (8) in such a manner that the frequency of the oscillation output signal of the voltage controlled oscillator in the state in which the second reference voltage ($V_{REF2}$) has been supplied to the voltage controlled oscillator becomes approximately equal to a second predetermined frequency (B) higher than the first predetermined frequency (A) during the execution of the second measurement of the frequency (refer to Steps 159 through 1513 of FIG. 15).

Thus, according to the embodiment, there can be provided a PLL able to have a desired frequency characteristic even though the manufacturing process of the semiconductor integrated circuit has some fluctuations.

In a semiconductor integrated circuit according to a preferred embodiment, the phase locked loop (PLL) further comprises a selector (7) controlled by the control unit (9).

The selector (7) selects the control voltage (Vc) of the predetermined level during the normal operating period. On the other hand, the selector (7) selects one of the first reference voltage ($V_{REF1}$) and the second reference voltage ($V_{REF2}$) during the calibration operating period and supplies the selected voltage to the control input of the voltage controlled oscillator (8) (refer to FIG. 12).

Figure 12:
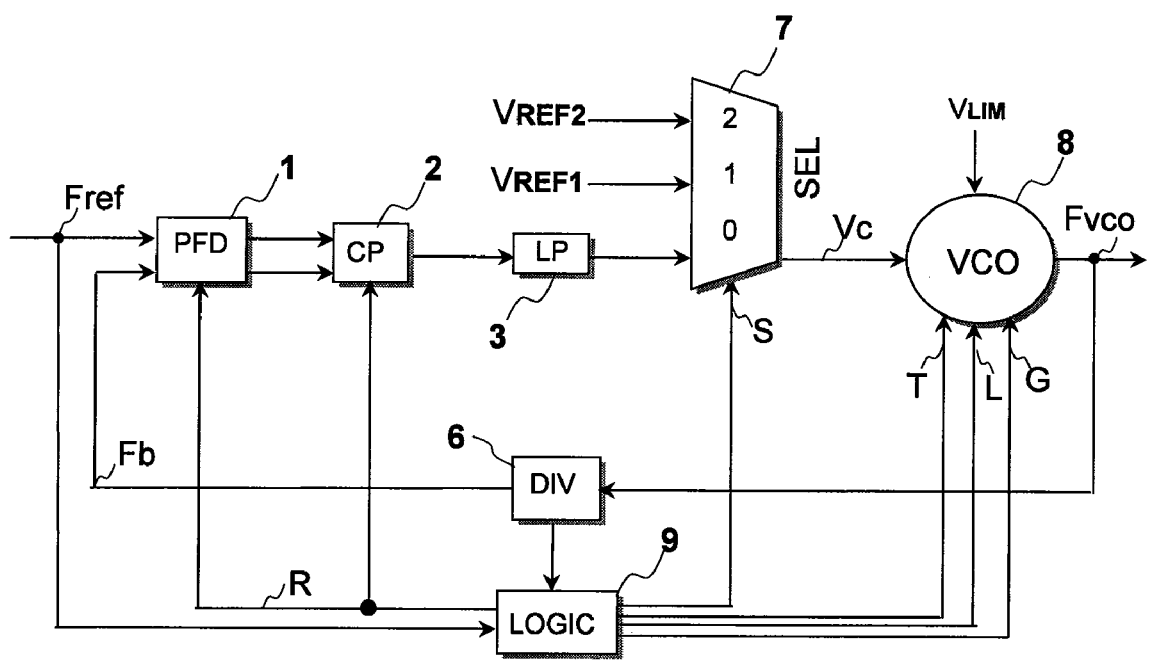
FIG. 12 is a diagram depicting a configuration of a PLL built in a semiconductor integrated circuit according to a third embodiment of the present invention.

In a semiconductor integrated circuit according to another preferred embodiment, the phase locked loop (PLL) further comprises a charge pump (2) which performs the discharge/discharge of the loop filter (3) in response to the output of the phase frequency detector (1) (refer to FIG. 12).

In a further preferred embodiment, the charge pump comprises a first charge pump (2a) and a second charge pump (2b).

The first charge pump (2a) and the second charge pump (2b) are driven in antiphase to each other in response to an up output signal (UP) and a down output signal (DN) each used as the output of the phase frequency detector (1) so that a first charge/discharge current (i1) of the first charge pump (2a) and a second charge/discharge current (i2) of the second charge pump (2b) are respectively set to a predetermined ratio (β).

The loop filter (3) comprises a resistor (R1) and a capacitor (C1) for determining a zero point frequency (f1). One end of the resistor (R1) is coupled to an input terminal of the loop filter (3), and the other end thereof is coupled to a ground potential (GND) via the capacitor (C1).

The one and other ends of the resistor (R1) of the loop filter (3) are respectively driven by the first charge/discharge current (i1) of the first charge pump (2a) and the second charge/discharge current (i2) of the second charge pump (2b).

The resistor (R1) and the capacitor (C1) of the loop filter (3) are built in a semiconductor chip (refer to FIG. 31).

A semiconductor integrated circuit according to a more preferred embodiment can be coupled between a pickup for performing data reading and writing of a disk used as a storage media of a disk recording/reproducing device, and a host computer.

The semiconductor integrated circuit comprises a host interface (2411, 2511) which supplies read data to the host computer and is supplied with write data from the host computer.

The semiconductor integrated circuit comprises a signal processing unit (2412, 2512) which performs the processing of a signal read from the pickup and performs the processing of a signal written into the pickup (refer to FIGS. 24 and 25).

The phase locked loop (PLL) generates a clock signal used in at least one of the host interface and the signal processing unit.

In a still more specific embodiment, the host interface (2411, 2511) is an ATA interface.

Description of Embodiments

Embodiments will next be described in further detail. Components each having the same function in all drawings for describing the best modes for carrying out the invention are respectively given the same reference numerals, and their repetitive explanations will therefore be omitted.

First Embodiment

Overall Configuration of PLL

FIG. 1 is a diagram for describing an overall configuration of a PLL built in a semiconductor integrated circuit according to a first embodiment of the present invention.

The PLL according to the first embodiment comprises a phase frequency detector (PFD) 1, a charge pump (CP) 2, a loop filter (LP) 3, a selector (SEL) 7, a voltage controlled oscillator (VCO) 8, a divider (DIV) 6, and a calibration adjustment unit 9.

A reference signal Fref and a feedback signal Fb outputted from the divider (DIV) 6 are respectively supplied to one input terminal of the phase frequency detector (PFD) 1 and the other input terminal thereof to thereby generate a phase-compared signal from its output. The phase-compared signal of the phase frequency detector 1 is supplied to the charge pump (CP) 2 to thereby generate a charge/discharge control signal from its output. The charge/discharge control signal of the charge pump 2 is supplied to the loop filter (LP) 3 to thereby generate a filter output signal from its output.

The filter output signal outputted from the loop filter (LP) 3, a ground potential GND, a reference voltage $V_{REF}$, and a selection signal S are supplied to the selector (SEL) 7 to thereby generate a control signal Vc from its output. Namely, in the selector (SEL) 7, any of the filter output signal, the ground potential GND and the reference voltage $V_{REF}$ is selected by the selection signal S so that the control voltage Vc is generated from its output. Incidentally, although the selector (SEL) 7 is coupled between the loop filter (LP) 3 and the voltage controlled oscillator (VCO) 8 in the first embodiment, the selector (SEL) 7 can also be coupled between the charge pump 2 and the loop filter (LP) 3.

The control voltage Vc outputted from the selector (SEL) 7 is supplied to the voltage controlled oscillator (VCO) 8 so that the frequency of an oscillation output signal $F_{VCO}$ of its output is controlled. The oscillation output signal $F_{VCO}$ outputted from the voltage controlled oscillator 8 is supplied to the divider (DIV) 6 to thereby generate a feedback signal Fb from the output of the divider 6. Further, the divider 6 supplies a division signal to the calibration adjustment unit (LOGIC) 9 in response to the oscillation output signal $F_{VCO}$ outputted from the voltage controlled oscillator 8. Incidentally, the frequency of the division signal is set to a frequency at which a logic circuit lying inside the calibration adjustment unit (LOGIC) 9 can be operated.

The calibration adjustment unit (LOGIC) 9 is supplied with the reference signal Fref and the division signal outputted from the divider 6 and generates a selection signal S, a frequency control sensitivity adjustment signal T, an offset frequency adjustment signal O and a control signal R. The selection signal S, the frequency control sensitivity adjustment signal T, the offset frequency adjustment signal O and the control signal R are utilized as adjustment signals at a calibration operation. Incidentally, as a specific example, the calibration adjustment unit (LOGIC) 9 can be comprised of a central processing unit (CPU) built in the semiconductor integrated circuit and an operation program which is operated on the CPU and executes predetermined logical arithmetic processing. This operation program is stored in a built-in non-volatile memory of the semiconductor integrated circuit, whereas information necessary for the logical arithmetic processing and data or the like about operational results are stored in a built-in memory of the semiconductor integrated circuit, such as a RAM or the like.

Incidentally, the divider (DIV) 6 and the calibration adjustment unit (LOGIC) 9 have been described in a separate form in the first embodiment. The divider (DIV) and the calibration adjustment unit (LOGIC) 9 can, however, also be implemented by integrated logic hardware.

<<Voltage Controlled Oscillator>>

FIG. 2 is a diagram showing a configuration of the voltage controlled oscillator (VCO) 8 included in the PLL according to the first embodiment of the present invention shown in FIG. 1.

Figure 26:
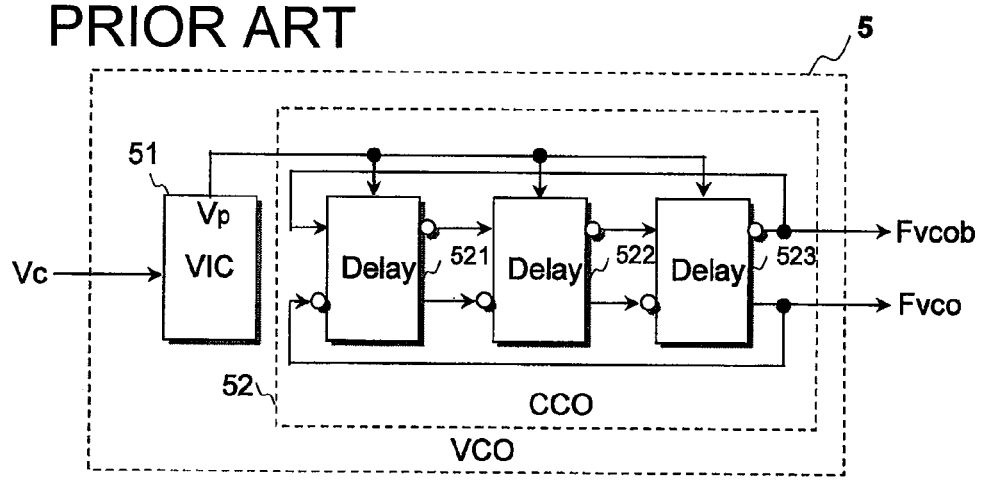
FIG. 26 is a diagram showing a voltage controlled oscillator included in a PLL examined by the present inventors et al. prior to the present invention.

The voltage controlled oscillator (VCO) 8 shown in FIG. 2 also comprises a voltage-current converter (VIC) 81 and a current controlled oscillator (CCO) 52 in a manner similar to the voltage controlled oscillator (VCO) 5 shown in FIG. 26. The current controlled oscillator (CCO) 52 configured as a ring oscillator comprises delays 521, 522 and 523 of odd-numbered stages. Incidentally, although the current controlled oscillator 8 has a three-stage configuration of delays in FIG. 2, it is needless to say that it may take a configuration of delays of odd-numbered stages other than three stages.

Figure 20:
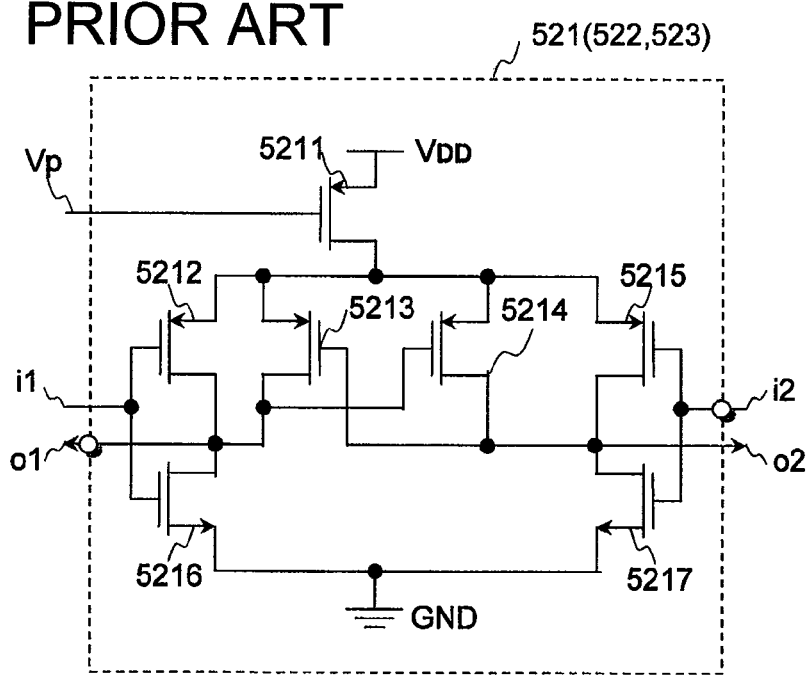
FIG. 20 is a diagram depicting a configuration of each of delay circuits of current controlled oscillators of the voltage controlled oscillators shown in FIGS. 2 and 26.

An inverse output signal Fvcob and a non-inverse output signal Fvco of the delay 523 of the final stage are respectively supplied to a non-inverse input terminal and an inverse input terminal of the delay 521 of the first stage. An inverse output signal and a non-inverse output signal of the delay 521 are respectively supplied to a non-inverse input terminal and an inverse input terminal of the delay 522 of the next stage. An inverse output signal and a non-inverse output signal of the delay 522 are respectively supplied to a non-inverse input terminal and an inverse input terminal of the delay 523. Incidentally, FIG. 20 is a diagram showing a configuration of each of the delays 521, 522 and 523 of the current controlled oscillator (CCO) 52 in the voltage controlled oscillator (VCO) 8 shown in FIG. 2.

When a control voltage (Vc) for controlling the oscillation frequency of the voltage controlled oscillator (VCO) 8 shown in FIG. 2 is supplied to its corresponding input terminal of the voltage-current converter (VIC) 81, the voltage-current converter (VIC) 81 executes voltage-current conversion to generate a converted current thereinside. This converted current is converted to an output voltage (Vp) by the voltage-current converter (VIC) 81. The output voltage (Vp) generated from an output terminal of the voltage-current converter (VIC) 81 is supplied to the delays 521, 522 and 523 of the current controlled oscillator (CCO) 52 as a bias voltage so that respective operating currents and delay times of the delays 521, 522 and 523 are set. The oscillation frequency of the voltage controlled oscillator (VCO) 8 is therefore decided.

In a calibration operation, a reference voltage $V_{LIM}$, a control voltage Vc outputted from the selector (SEL) 7, and a frequency control sensitivity adjustment signal T and an offset frequency adjustment signal O outputted from a calibration adjustment unit (LOGIC) 9 are supplied to the voltage-current converter (VIC) 81 of the voltage controlled oscillator (VCO) 8 shown in FIG. 8.

<<Configuration of Voltage-Current Converter>>

Figure 3:
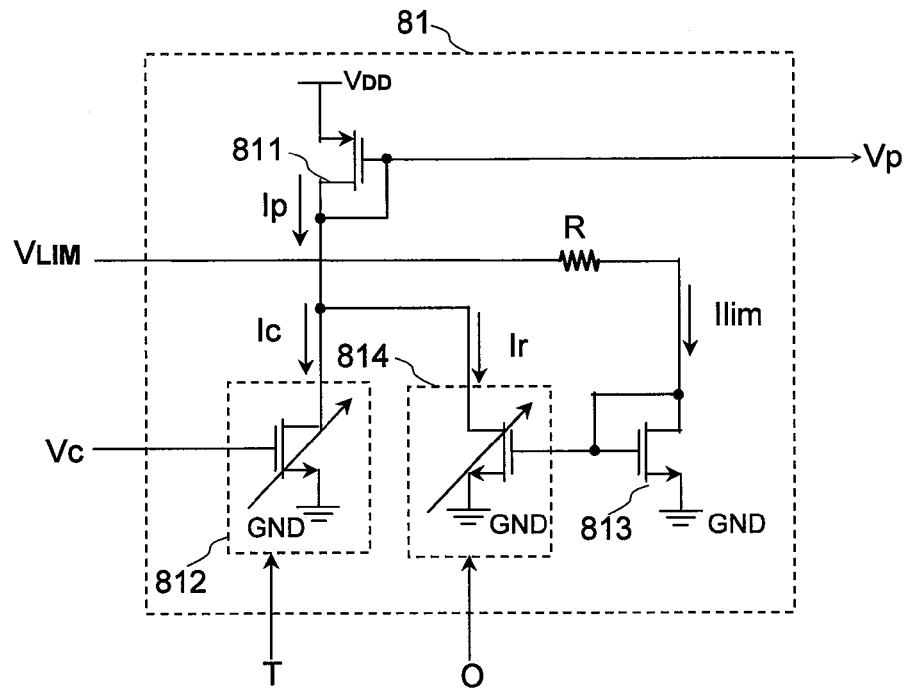
FIG. 3 is a diagram illustrating a configuration of a voltage-current converter included in the voltage controlled oscillator shown in FIG. 2.

FIG. 3 is a diagram showing a configuration of the voltage-current converter (VIC) 81 included in the voltage controlled oscillator (VCO) 8 shown in FIG. 2.

The voltage-current converter (VIC) 81 shown in FIG. 3 comprises a P channel MOS transistor 811, a frequency control sensitivity trimming N channel MOS transistor 812, a reference current N channel MOS transistor 813, an offset frequency trimming N channel MOS transistor 814 and a resistor R.

The control voltage Vc is supplied to the gate of the frequency control sensitivity trimming N channel MOS transistor 812, and its gain and drain current Ic can be adjusted by the frequency control sensitivity adjustment signal T. The reference current N channel MOS transistor 813 diode-coupled by coupling its gate and drain is supplied, from the reference voltage $V_{LIM}$, with a reference current Ilim whose current value is set by the resistor R. A voltage applied between both terminals of the diode-coupled reference current N channel MOS transistor 813 is supplied between the gate and source of the offset frequency trimming N channel MOS transistor 814 that configures a current mirror along with the diode-coupled reference current N channel MOS transistor 813. The gain and drain offset current Ir of the offset frequency trimming N channel MOS transistor 814 can be adjusted by the offset frequency adjustment signal O. Thus, a control current Ip that flows through the P channel MOS transistor 811 diode-coupled by coupling its gate and drain becomes a current Ic+Ir corresponding to the sum of the drain current Ic of the frequency control sensitivity trimming N channel MOS transistor 812 and the drain offset current Ir of the offset frequency trimming N channel MOS transistor 814. The total current Ic+Ir is converted to an output voltage Vp by the P channel MOS transistor 811. The output voltage Vp is supplied to the delays 521, 522 and 523 of the current controlled oscillator (CCO) 52 of the voltage controlled oscillator (VCO) 8 as a bias voltage, so that respective operating currents and delay times of the delays 521, 522 and 523 are set. An oscillation frequency of the voltage controlled oscillator (VCO) 8 is therefore determined.

<<Trimming Transistor>>

Figure 4:
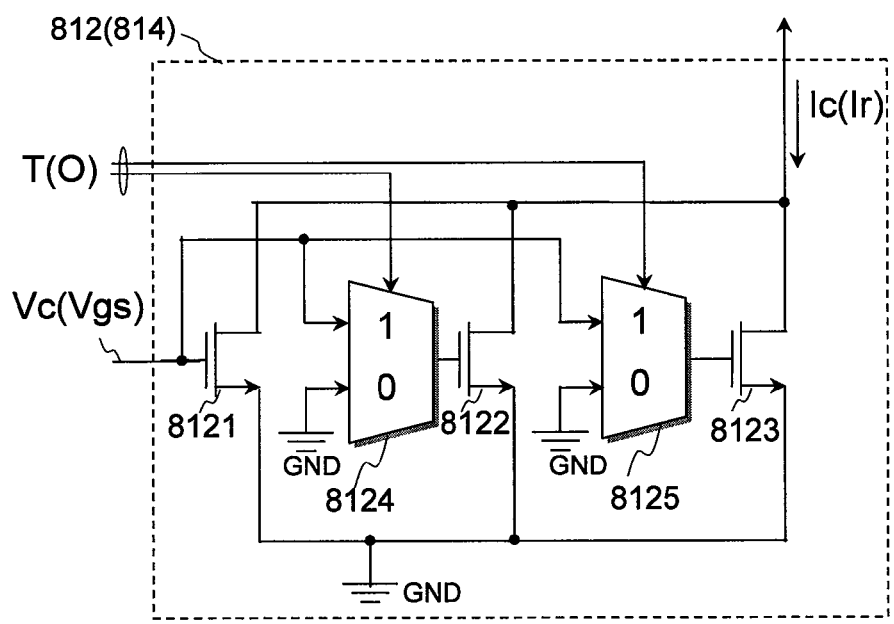
FIG. 4 is a diagram depicting a configuration of a frequency control sensitivity trimming N channel MOS transistor included in the voltage-current converter shown in FIG. 3.

FIG. 4 is a diagram showing a configuration of the frequency control sensitivity trimming N channel MOS transistor 812 included in the voltage-current converter (VIC) 81 shown in FIG. 3.

The trimming N channel MOS transistor 812 comprises a plurality of N channel MOS transistors 8121, 8122 and 8123 whose drain-source current paths are coupled in parallel, and a plurality of selectors 8124 and 8125. A gate of the first N channel MOS transistor 8121 is supplied with the control voltage Vc from the selector (SEL) 7 of the PLL shown in FIG. 1. A gate of the second N channel MOS transistor 8122 and a gate of the third N channel MOS transistor 8123 are respectively supplied with an output signal of the first selector 8124 and an output signal of the second selector 8125. A first input terminal of the first selector 8124 and a first input terminal of the second selector 8125 are supplied with the control voltage Vc of the selector (SEL) 7. A second input terminal of the first selector 8124 and a second input terminal of the second selector 8125 are supplied with a ground potential GND. Further, first and second bits of the frequency control sensitivity adjustment signal T are respectively supplied to an input selection terminal of the first selector 8124 and an input selection terminal of the selector 8125. The first selector 8124 and the second selector 8125 select one of the control voltage Vc of the selector (SEL) 7 and the ground potential GND in response to the first and second bits of the frequency control sensitivity adjustment signal T and transfers the same to their outputs. Thus, the gain and drain current Ic of the frequency control sensitivity trimming N channel MOS transistor 812 can be adjusted in accordance with the frequency control sensitivity adjustment signal T.

On the other hand, the offset frequency trimming N channel MOS transistor 814 included in the voltage-current converter (VIC) 81 shown in FIG. 3 can also be configured by the circuit coupling as shown in FIG. 4 in a manner similar to the frequency control sensitivity trimming N channel MOS transistor 812. When the circuit coupling shown in FIG. 4 is used as the offset frequency trimming N channel MOS transistor 814, the offset frequency adjustment signal O is supplied instead of the frequency control sensitivity adjustment signal T, and a gate-to-source voltage Vgs of the diode-coupled reference current N channel MOS transistor 813 of the voltage-current converter (VIC) 81 of FIG. 3 is supplied instead of the control voltage Vc outputted from the selector (SEL) 7. In doing so, the gain and drain current Ir of the offset frequency trimming N channel MOS transistor 814 can be adjusted in accordance with the offset frequency adjustment signal O.

<<Selector Inside Trimming Transistor>>

Figure 19:
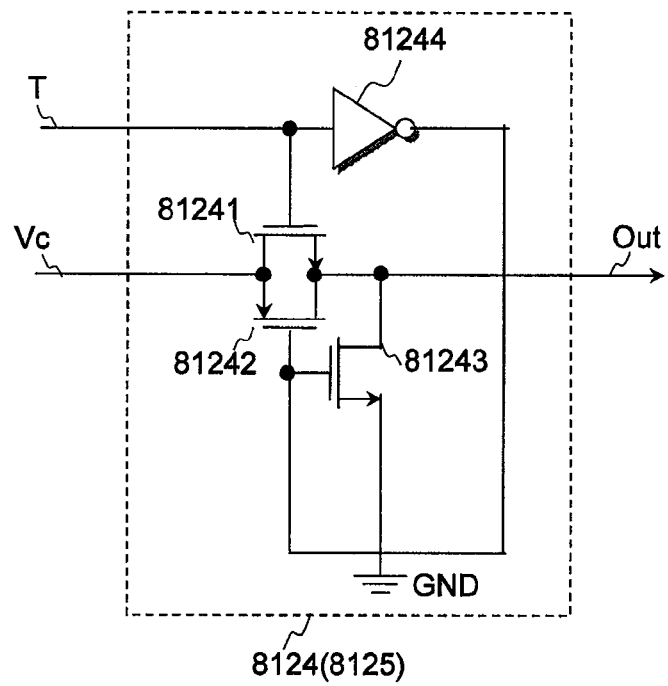
FIG. 19 is a diagram illustrating a configuration of a selector included in the frequency control sensitivity trimming N channel MOS transistor shown in FIG. 4.

FIG. 19 is a diagram showing a configuration of each of the selectors 8124 and 8125 included in the frequency control sensitivity trimming N channel MOS transistor 812 shown in FIG. 4.

The selector 8124 (8125) shown in FIG. 19 comprises a CMOS inverter 81244, N channel MOS transistors 81241 and 81243 and a P channel MOS transistor 81242.

When the frequency control sensitivity adjustment signal T is high in level, the N channel MOS transistor 81241 is turned on so that the output of the CMOS inverter 81244 is brought to a low level. Thus, the P channel MOS transistor 81242 is turned on and the N channel MOS transistor 81243 is turned off. Accordingly, at this time, the control voltage Vc is transferred to an output Out via the N channel MOS transistor 81241 and the P channel MOS transistor 81242. When the frequency control sensitivity adjustment signal T is low in level, the N channel MOS transistor 81241 is turned off so that the output of the CMOS inverter 81244 is brought to a high level. Thus, the P channel MOS transistor 81242 is turned off and the N channel MOS transistor 81243 is turned on. Accordingly, at this time, the output Out is brought to a ground potential GND by the N channel MOS transistor 81242 placed in the on state.

<<Operation of Voltage-Current Converter>>

The operation of the voltage-current converter (VIC) 81 shown in FIG. 3 will next be explained.

Since the frequency control sensitivity trimming N channel MOS transistor 812 is in an off state when the control voltage Vc of the selector (SEL) 7 is zero volts, the drain current Ic is zero.

On the other hand, since the reference voltage $V_{LIM}$ is of a reference voltage generated from a reference voltage generating circuit such as a bandgap reference (BGR) or the like, the value of the reference current Ilim set by the resistor R becomes a constant value without depending on the control voltage Vc. Thus, assuming that the current mirror ratio between the reference current N channel MOS transistor 813 and the offset frequency trimming N channel MOS transistor 814 is assumed to be 1:N, the drain offset current Ir of the offset frequency trimming N channel MOS transistor 814 becomes Ir=N*Ilim. Here, the current mirror ratio N between the reference current N channel MOS transistor 813 and the offset frequency trimming N channel MOS transistor 814 can be adjusted in response to the offset frequency adjustment signal O. Thus, when the value of the offset frequency adjustment signal O increases, the value of the drain offset current Ir also increases. Further, the value of the control current Ip given from the relationship of Ip=Ic+Ir also increases.

FIG. 32 is a diagram for describing the operation of the voltage-current converter (VIC) 81 shown in FIG. 3.

Since the drain offset current Ir also increases when the value of the offset frequency adjustment signal O increases in a range of 0 to 3 as shown in FIG. 32, the value of a control current Ip at the control voltage Vc=0 increases.

When the control voltage (Vc) increases more than a threshold voltage Vthn of the frequency control sensitivity trimming N channel MOS transistor 812, the drain current Ic thereof increases from zero. Since the control current Ip is given based on the relationship of Ip=Ic+Ir, the value of the control current Ip also increases as the control voltage Vc increases more than the threshold voltage Vthn of the frequency control sensitivity trimming N channel MOS transistor 812.

Namely, assuming that the conductance of the frequency control sensitivity trimming N channel MOS transistor 812 is gm, the drain current Ic of the frequency control sensitivity trimming N channel MOS transistor 812 is given in accordance with the relationship of Ic=gm*Vc. Thus, when the control voltage Vc increases in a region in which the control voltage Vc is higher than the threshold voltage Vthn of the frequency control sensitivity trimming N channel MOS transistor 812 as shown in FIG. 32, the value of the control current Ip also increases.

The conductance gm of the frequency control sensitivity trimming N channel MOS transistor 812 can be adjusted by the value of the frequency control sensitivity adjustment signal T. Namely, as shown in FIG. 4, the rate of activation of the N channel MOS transistors 8121, 8122 and 8123 lying inside the frequency control sensitivity trimming N channel MOS transistor 812 can be adjusted by the value of the frequency control sensitivity adjustment signal T. When the value of the frequency control sensitivity adjustment signal T increases, the activation rate, the conductance gm of the frequency control sensitivity trimming N channel MOS transistor 812 and the drain current Ic increase.

FIG. 33 is a diagram for describing the operation of the voltage-current converter (VIC) 81 shown in FIG. 3.

In the region in which the control voltage Vc is higher than the threshold voltage Vthn of the frequency control sensitivity trimming N channel MOS transistor 812 as shown in FIG. 33, the conductance gm and drain current Ic of the frequency control sensitivity trimming N channel MOS transistor 812 increase as the value of the frequency control sensitivity adjustment signal T increases. Therefore, the value of the control current Ip given in the relational expression of Ip=Ic+Ir also increases.

The PLL of the first embodiment shown in FIG. 1, which has been described above, includes the calibration operating period and the normal operating period. During the first calibration operating period, the PLL is controlled to the open loop, so that the frequency characteristic of the voltage controlled oscillator (VCO) 8 is adjusted to a desired characteristic by the calibration adjustment unit (LOGIC) 9. During the normal operation period after the calibration operation, the PLL is controlled to the closed loop, so that the phase and frequency of the output signal of the divider (DIV) 6 responsive to the output signal of the voltage controlled oscillator (VCO) 8 of the PLL respectively coincide with the phase and frequency of the reference signal supplied to the phase detector (PFD) 1, thereby enabling a lock operation of the PLL.

<<Calibration Operation>>

The calibration operation will next be explained in detail.

The calibration operation to be described below is automatically started by the calibration adjustment unit (LOGIC) 9 when the supply of an operating source voltage to the semiconductor integrated circuit with the PLL built therein is started by the first embodiment of the present invention shown in FIG. 1, for example. With the calibration operation, an adjustment value for setting the built-in PLL to the desired characteristic is acquired and the so-acquired adjustment value is stored in the built-in memory of the semiconductor integrated circuit such as RAM or the like. When the calibration operation is completed in this way, the calibration adjustment unit (LOGIC) 9 automatically switches the operation of the PLL built-in semiconductor integrated circuit to the normal operation.

During the period of the calibration operation, the PLL according to the first embodiment of the present invention shown in FIG. 1 is controlled to the open loop, so that the frequency control sensitivity adjustment signal T and the offset frequency adjustment signal O are updated until the frequency characteristic of the voltage controlled oscillator (VCO) 8 reaches the desired characteristic. The frequency characteristic of the voltage controlled oscillator (VCO) 8 of the PLL controlled to the open loop is monitored and the updating thereof is stopped when the frequency characteristic is brought to the desired characteristic, whereby the calibration operation is completed.

FIG. 5 is a diagram for describing the calibration operation of the PLL according to the first embodiment of the present invention shown in FIG. 1.

Since the selection signal S becomes S="1" at Step 51 when the calibration operation of the PLL shown in FIG. 1 is started, the selector (SEL) 7 of the PLL shown in FIG. 1 selects a ground potential GND corresponding to an input as a control voltage Vc corresponding to an output. Since, at this time, the phase frequency detector (PFD) 1 and the charge pump (CP) 2 are respectively controlled to a standby state by a control signal R high in level, the PLL is controlled to an open loop. At this time, the frequency control sensitivity adjustment signal T and the offset frequency adjustment signal O are respectively set to T="0" and O="0". In this initial state, the calibration adjustment unit (LOGIC) 9 starts counting a divided signal of an output signal (Fvco) of the voltage controlled oscillator (VCO) 8 by the divider (DIV) 6 at Step 52.

The calibration adjustment unit (LOGIC) 9 compares a count result N1 of the output signal (Fvco) with a target value A at Step 53. Incidentally, the target value A corresponds to an offset frequency corresponding to one target frequency characteristic of the voltage controlled oscillator (VCO) 8. When the calibration adjustment unit (LOGIC) 9 determines that N1 and A are expressed in a relationship of N1<A, the calibration adjustment unit (LOGIC) 9 updates the offset frequency adjustment signal O to O=0+1 at Step 54.

The frequency of the output signal (Fvco) of the voltage controlled oscillator (VCO) 8 increases in response to the control voltage Vc corresponding to the ground potential GND selected by the selector (SEL) 7 and the updated offset frequency adjustment signal O. There is a possibility that an increase in the frequency of the output signal (Fvco) will be insufficient at first and the determination as to the relationship of N1<A will continue at Step 53. There is a possibility that the updating of the offset frequency adjustment signal O at Step 54 will continue. However, the increase in the frequency of the output signal (Fvco) becomes sufficient gradually and the relationship of N1>A is determined at Step 53.

Figure 6:
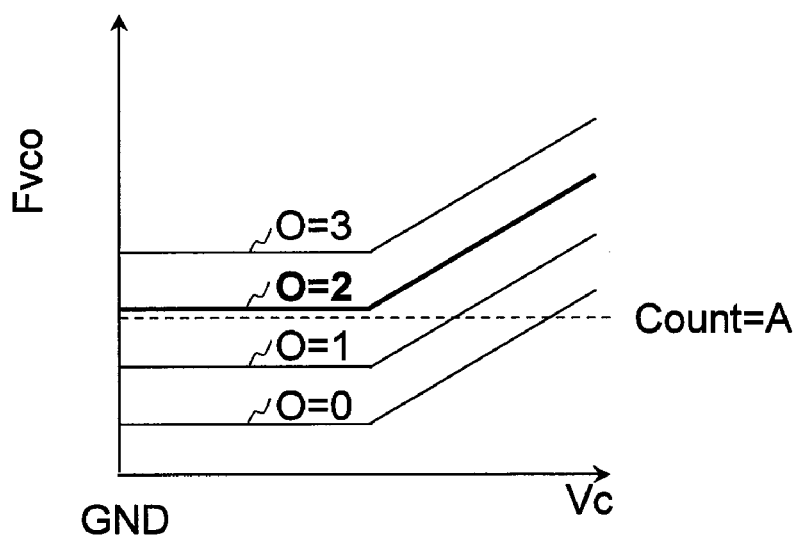
FIG. 6 is a diagram showing the manner in which the offset frequency of a signal outputted from the voltage controlled oscillator increases in response to the updating of an offset frequency adjustment signal in the calibration operation of the PLL according to the first embodiment of the present invention shown in FIG. 1.

FIG. 6 is a diagram showing the manner in which the offset frequency of an output signal (Fvco) of the voltage controlled oscillator (VCO) 8 increases in response to the updating of an offset frequency adjustment signal O in the calibration operation of the PLL according to the first embodiment of the present invention shown in FIG. 1.

Since a relationship of N1>A targeted when the updated value of the offset frequency adjustment signal O is "2" is first determined in the example of FIG. 6, the final updated value of the offset frequency adjustment signal O is set to "2". Namely, at Step 55, the calibration adjustment unit (LOGIC) 9 sets the offset frequency adjustment signal O to the final updated value "2" (O=O@N1>A hold) and changes the selection signal S from S="1" to S="2".

When the calibration of the offset frequency adjustment signal O of the voltage controlled oscillator (VCO) 8 is completed in this way, the calibration operation proceeds to the calibration of the frequency control sensitivity adjustment signal T.

First, the selector (SEL) 7 of the PLL shown in FIG. 1 switches an input ground potential GND to a reference voltage $V_{REF1}$ as an output control voltage Vc in response to the change of the selection signal S from S="1" to S="2". At this time, the frequency control sensitivity adjustment signal T is initially set to T="0". The frequency of the output signal (Fvco) of the voltage controlled oscillator (VCO) 8 slightly increases in response to the change of the control voltage Vc supplied from the selector (SEL) 7 of the PLL shown in FIG. 1 to the voltage controlled oscillator (VCO) 8 from the ground potential GND to the reference voltage $V_{REF}$.

In this initial condition, the calibration adjustment unit (LOGIC) 9 starts counting a divided signal of the output signal (Fvco) of the voltage controlled oscillator (VCO) 8 by the divider (DIV) 6 at Step 56. The calibration adjustment unit (LOGIC) 9 compares a count result N2 of the output signal (Fvco) with a target value B at Step 57. Incidentally, the target value B corresponds to frequency control sensitivity corresponding to another target frequency characteristic of the voltage controlled oscillator (VCO) 8. When the calibration adjustment unit (LOGIC) 9 determines a relationship of N2<B at Step 57, it updates the frequency control sensitivity adjustment signal T to T=T+1 at Step 58.

The frequency of the output signal (Fvco) of the voltage controlled oscillator (VCO) 8 increases in response to the increase and updating of the frequency control sensitivity adjustment signal T. There is a possibility that an increase in the frequency will be insufficient at first and the determination as to the relationship of N2<B at Step 57 will continue. There is a possibility that the updating of the frequency control sensitivity adjustment signal T at Step 58 will continue. However, the increase in the frequency becomes sufficient gradually and the relationship of N2>B is determined at Step 57.

FIG. 7 is a diagram showing the manner in which the frequency of an output signal (Fvco) of the voltage controlled oscillator (VCO) 8 increases in response to the updating of a frequency control sensitivity adjustment signal T in the calibration operation of the PLL according to the first embodiment of the present invention shown in FIG. 1.

Since a relationship of N2>B targeted when the updated value of the frequency control sensitivity adjustment signal T is "2" is first determined in the example of FIG. 7, the final updated value of the frequency control sensitivity adjustment signal T is set to "2". Namely, at Step 59, the calibration adjustment unit (LOGIC) 9 sets the frequency control sensitivity adjustment signal T to the final updated value "2" (T=T@N2>B hold) and restores the selection signal S from S="2" to S="0". Since, at this time, the calibration adjustment unit (LOGIC) 9 restores the control signal R from a high level to a low level, the phase frequency detector (PFD) 1 and the charge pump (CP) 2 are controlled to an active state in response to the control signal R low in level. Therefore, the PLL is controlled to a closed loop. In response to the selection signal S="0", the selector (SEL) 7 switches the input reference voltage $V_{REF}$ to the output signal of the loop filter (LP) 3 as the output's control voltage Vc. Thus, the PLL is brought to the normal operating period corresponding to the closed loop, so that the phase and frequency of the output signal of the divider (DIV) 6 responsive to the output signal of the voltage controlled oscillator (VCO) 8 of the PLL respectively coincide with the phase and frequency of the reference signal Fref, thereby enabling a lock operation of the PLL.

Thus, the calibration of the offset frequency adjustment signal O of the voltage controlled oscillator (VCO) 8 in the PLL and the calibration of the frequency control sensitivity adjustment signal T can be executed by the calibration operation shown in FIG. 5. Incidentally, the value of the reference voltage $V_{REF}$ is set extremely close to the value of the control voltage Vc supplied from the loop filter (LP) 3 to the voltage controlled oscillator 8 for the PLL lock operation during the normal operating period of the PLL. Namely, the frequency fvco of the output signal (Fvco) of the voltage controlled oscillator (VCO) 8 during the normal operating period of the PLL according to the first embodiment of the present invention shown in FIG. 1 is given in terms of a relational expression of fvco=N*fref assuming that the division ratio of the divider (DIV) 6 is N and the frequency of the reference signal Fref is fref. Thus, the reference voltage $V_{REF}$ set extremely close to the value of such a control voltage Vc as to obtain the oscillation output signal (Fvco) having the frequency fvco given in this relational expression, is supplied to the voltage controlled oscillator 8 during the period of the calibration operation.

Figure 27:
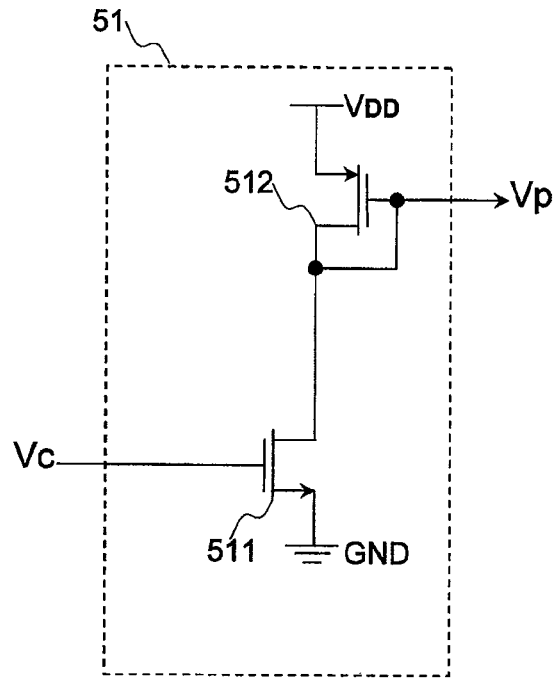
FIG. 27 is a diagram illustrating a configuration of a voltage-current converter of the voltage controlled oscillator shown in FIG. 26.

FIG. 34 is a diagram showing a frequency characteristic L1 of the voltage controlled oscillator (VCO) 5 examined prior to the present invention by the present inventors et al., which includes the voltage-current converter (VIC) 51 of FIG. 27 and has been shown in FIG. 26, and a frequency characteristic L2 of the voltage controlled oscillator (VCO) 8 according to the first embodiment of the present invention, which has been described in FIGS. 1 through 7 and FIGS. 32 and 33.

The control voltages $V_{REF}$ for generating the target oscillation frequencies Fvco of both voltage controlled oscillators (VCO) 5 and 8 are supplied to VCO. The threshold voltages of the N channel MOS transistors 812 and 511 supplied with the control voltages Vc at the voltage-current converters (VIC) 81 and 51 shown in FIGS. 3 and 27 are assumed to be Vthn. Further, the offset frequency of the voltage controlled oscillator (VCO) 8 adjusted by the calibration operation according to the first embodiment of the present invention is assumed to be Fof. Incidentally, the value of the control voltage $V_{REF}$ is set extremely close to the value of the control voltage Vc supplied from the loop filter (LP) 3 to the voltage controlled oscillator for the lock operation of the PLL during the normal operating period of the PLL.

As shown in the frequency characteristic L1 of FIG. 34, the frequency control sensitivity Kv of the voltage controlled oscillator (VCO) 5 examined prior to the present invention by the present inventors et al. has been given in the relational expression of Kv=Fvco/($V_{REF}$−Vthn) and was extremely high frequency control sensitivity Kv. As a result, a problem arose in that since the oscillation output frequency of the VCO fluctuated greatly due to noise contained in the control voltage Vc, a satisfactory jitter characteristic was not obtained.

As shown in the frequency characteristic L2 of FIG. 34 contrary to it, the frequency control sensitivity Kv of the voltage controlled oscillator (VCO) 8 according to the first embodiment of the present invention is given in the relational expression of Kv=(Fvco−Fof)/($V_{REF}$−Vthn) and becomes relatively low frequency control sensitivity Kv. Thus, since the oscillation output frequency of the VCO does not fluctuate greatly due to noise contained in the control voltage Vc, a satisfactory jitter characteristic can be obtained. Further, undesired band widening of the PLL can also be reduced.

Thus, according to the first embodiment of the present invention, it is possible to mitigate the problem that the frequency control sensitivity Kv becomes large due to a low threshold voltage and a low source voltage based on the adoption of a miniaturized manufacturing process. The calibration operation according to the first embodiment of the present invention makes it possible to set the frequency control sensitivity Kv to a target value with a high degree of accuracy without being set to an extremely low value.

Second Embodiment

FIG. 8 is a diagram showing a configuration of a PLL built in a semiconductor integrated circuit according to a second embodiment of the present invention.

Incidentally, the second embodiment of the present invention shown in FIG. 8 corresponds to a modification of the first embodiment of the present invention. The PLL shown in FIG. 8 differs from the PLL shown in FIG. 1 in that the function of causing a selector (SEL) 7 to select a second reference voltage $V_{REF2}$ in response to a selection signal S="3" is added to the function of causing the selector (SEL) 7 to select an output signal of a loop filter (LP) 3, a ground potential GND and a first reference voltage $V_{REF1}$ as an output control voltage Vc in response to selection signals S="0", "1" and "2" respectively.

A calibration operation will next be explained in detail.

During the calibration operation, the PLL according to the second embodiment of the present invention shown in FIG. 8 is controlled to an open loop in a manner similar to the first embodiment, so that a frequency control sensitivity adjustment signal T and an offset frequency adjustment signal O are updated until a frequency characteristic of a voltage controlled oscillator (VCO) 8 is brought to a desired characteristic. The frequency characteristic of the voltage controlled oscillator (VCO) 8 of the PLL controlled to the open loop is monitored and the updating thereof is stopped when the frequency characteristic is brought to the desired characteristic, whereby the calibration operation is completed.

FIG. 9 is a diagram for describing the calibration operation of the PLL according to the second embodiment of the present invention shown in FIG. 8.

Since the selection signal S becomes S="1" at Step 90 when the calibration operation of the PLL shown in FIG. 8 is started, the selector (SEL) 7 of the PLL shown in FIG. 8 selects an input ground potential GND as an output control voltage Vc. Since, at this time, a phase frequency detector (PFD) 1 and a charge pump (CP) 2 are respectively controlled to a standby state by a control signal R high in level, the PLL is controlled to an open loop. At this time, the frequency control sensitivity adjustment signal T and the offset frequency adjustment signal O are respectively set to T="0" and O="0". In this initial state, a calibration adjustment unit (LOGIC) 9 starts counting a divided signal of an output signal (Fvco) of the voltage controlled oscillator (VCO) 8 by a divider (DIV) 6 at Step 91.

The calibration adjustment unit (LOGIC) 9 compares a count result N1 of the output signal (Fvco) with a target value A at Step 92. Incidentally, the target value A corresponds to an offset frequency corresponding to one target frequency characteristic of the voltage controlled oscillator (VCO) 8. When the calibration adjustment unit (LOGIC) 9 determines that N1 and A are expressed in a relationship of N1<A, the calibration adjustment unit (LOGIC) 9 updates the offset frequency adjustment signal O to O=0+1 at Step 93.

The frequency of the output signal (Fvco) of the voltage controlled oscillator (VCO) 8 increases in response to the control voltage Vc corresponding to the ground potential GND selected by the selector (SEL) 7 and the updated offset frequency adjustment signal O. There is a possibility that an increase in the frequency of the output signal (Fvco) will be insufficient at first and the determination as to the relationship of N1<A will continue at Step 92. There is a possibility that the updating of the offset frequency adjustment signal O at Step 93 will continue. However, the increase in the frequency of the output signal (Fvco) becomes sufficient gradually and the relationship of N1>A is determined at Step 92.

Figure 10:
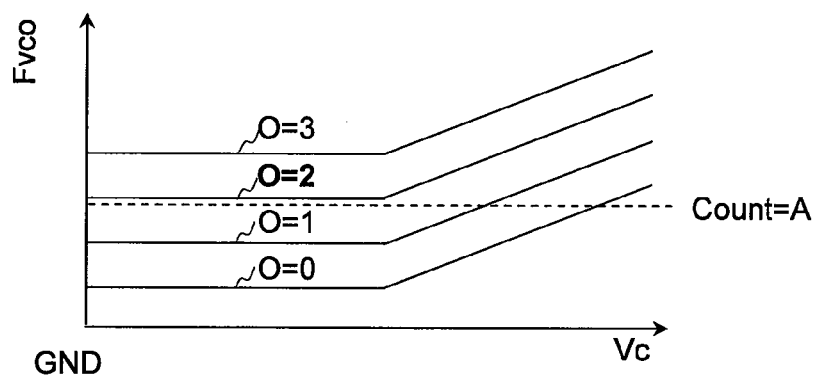
FIG. 10 is a diagram showing the manner in which the offset frequency of a signal outputted from a voltage controlled oscillator increases in response to the updating of an offset frequency adjustment signal in the calibration operation of the PLL according to the second embodiment of the present invention shown in FIG. 8.

FIG. 10 is a diagram showing the manner in which the offset frequency of an output signal (Fvco) of the voltage controlled oscillator (VCO) 8 increases in response to the updating of an offset frequency adjustment signal O in the calibration operation of the PLL according to the second embodiment of the present invention shown in FIG. 8.

Since a relationship of N1>A targeted when the updated value of the offset frequency adjustment signal O is "2" is first determined even in the example of FIG. 10, the final updated value of the offset frequency adjustment signal O is set to "2". Namely, at Step 94, the calibration adjustment unit (LOGIC) 9 sets the offset frequency adjustment signal O to the final updated value "2" (O=O@N1>A hold) and changes the selection signal S from S="1" to S="2".

When the calibration of the offset frequency adjustment signal O of the voltage controlled oscillator (VCO) 8 is completed in this way, the calibration operation proceeds to the calibration of the frequency control sensitivity adjustment signal T.

First, the selector (SEL) 7 of the PLL shown in FIG. 8 switches an input ground potential GND to a first reference voltage $V_{REF1}$ as an output control voltage Vc in response to the change of the selection signal S from S="1" to S="2". At this time, the frequency control sensitivity adjustment signal T is initially set to T="0". The frequency of the output signal (Fvco) of the voltage controlled oscillator (VCO) 8 slightly increases in response to the change of the control voltage Vc supplied from the selector (SEL) 7 of the PLL shown in FIG. 8 to the voltage controlled oscillator (VCO) 8 from the ground potential GND to the first reference voltage $V_{REF1}$. In this condition, the calibration adjustment unit (LOGIC) 9 starts counting a divided signal of the output signal (Fvco) of the voltage controlled oscillator (VCO) 8 by the divider (DIV) 6 at Step 95 and stores a count result N2 in a built-in memory of the semiconductor integrated circuit.

Next, the calibration adjustment unit (LOGIC) 9 changes the selection signal S from S="2" to S="3" at Step 96. In doing so, the selector (SEL) 7 of the PLL shown in FIG. 8 switches the input first reference voltage $V_{REF1}$ to a second reference voltage $V_{REF2}$ slightly higher in level than it as the output control voltage Vc in response to the change of the selection signal S from S="2" to S="3". The frequency of the output signal (Fvco) of the voltage controlled oscillator (VCO) 8 slightly increases in response to the change of the control voltage Vc supplied to the voltage controlled oscillator (VCO) 8 from the first reference voltage $V_{REF1}$ to the second reference voltage $V_{REF2}$. In this state, the calibration adjustment unit (LOGIC) 9 starts counting a divided signal of the output signal (Fvco) of the voltage controlled oscillator (VCO) 8 by the divider (DIV) 6 at Step 96 and stores a count result N3 in the built-in memory of the semiconductor integrated circuit.

Next, at Step 97, the calibration adjustment unit (LOGIC) 9 compares the count result N3 of the output signal (Fvco) with a target value B and further compares a difference N3−N2 between the count result N3 and the count result N2 with a target value C. Incidentally, the target value B with the target value C respectively correspond to a VCO oscillation frequency and AC frequency control sensitivity each corresponding to a target frequency characteristic of the voltage controlled oscillator (VCO) 8. The VCO oscillation frequency indicates the oscillation frequency of the voltage controlled oscillator (VCO) 8 where the control voltage Vc is set to a predetermined value, whereas the AC frequency control sensitivity indicates control sensitivity of a width of change in the oscillation frequency of the voltage controlled oscillator (VCO) 8 when the control voltage Vc changes in a predetermined range. When the calibration adjustment unit (LOGIC) 9 determines at Step 97 that the count result and the target value are expressed in a relationship of N3<B or a relationship of N3−N2<C, the frequency control sensitivity adjustment signal T is updated to T=T+1 at Step 98.

The frequency of the output signal (Fvco) of the voltage controlled oscillator (VCO) 8 increases in response to the increase and updating of the frequency control sensitivity adjustment signal T. There is a possibility that an increase in the frequency will be insufficient at first and the determination as to the relationship of N3<B or the relationship of N3−N2<C at Step 97 will continue. There is a possibility that the updating of the frequency control sensitivity adjustment signal T at Step 98 will continue. However, the increase in the frequency becomes sufficient gradually and the relationship of N3>B and the relationship of N3−N2>C are determined at Step 97.

Figure 11:
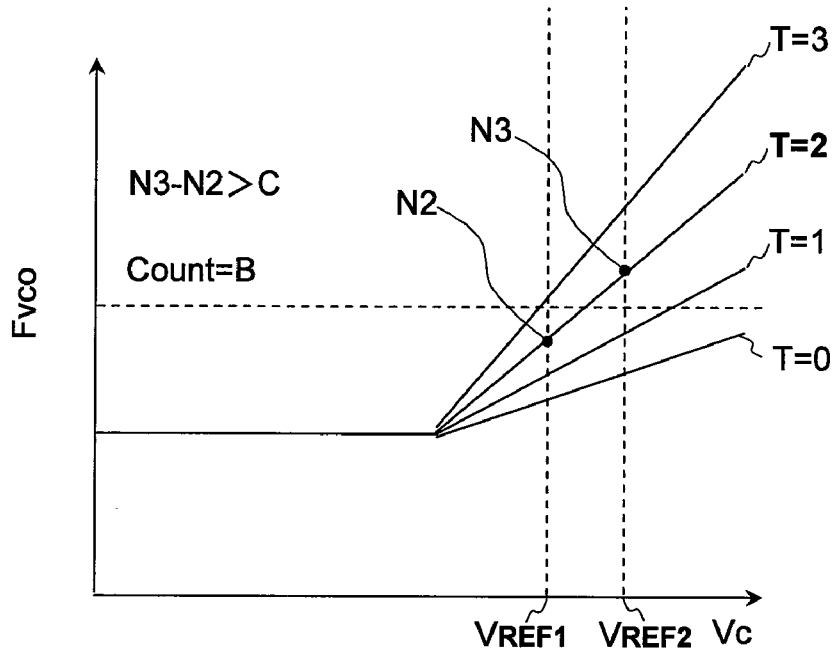
FIG. 11 is a diagram illustrating the manner in which the frequency of a signal outputted from the voltage controlled oscillator increases in response to the updating of a frequency control sensitivity adjustment signal in the calibration operation of the PLL according to the second embodiment of the present invention shown in FIGS. 8 and 9.

FIG. 11 is a diagram showing the manner in which the frequency of an output signal (Fvco) of the voltage controlled oscillator (VCO) 8 increases in response to the updating of a frequency control sensitivity adjustment signal T in the calibration operation of the PLL according to the second embodiment of the present invention shown in FIGS. 8 and 9.

Since a relationship of N3>B and a relationship of N3−N2>C targeted when the updated value of the frequency control sensitivity adjustment signal T is "2" are first determined in the example of FIG. 11, the final updated value of the frequency control sensitivity adjustment signal T is set to "2". Namely, at Step 99, the calibration adjustment unit (LOGIC) 9 sets the frequency control sensitivity adjustment signal T to the final updated value "2" (T=T@N3>B and N3−N2>C hold) and restores the selection signal S from S="2" to S="0". Since, at this time, the calibration adjustment unit (LOGIC) 9 restores the control signal R from a high level to a low level, the phase frequency detector (PFD) 1 and the charge pump (CP) 2 are controlled to an active state in response to the control signal R low in level. Therefore, the PLL is controlled to a closed loop. In response to the selection signal S="0", the selector (SEL) 7 switches the input reference voltage $V_{REF}$ to the output signal of the loop filter (LP) 3 as the output's control voltage Vc. Thus, the PLL is brought to the normal operating period corresponding to the closed loop, so that the phase and frequency of the output signal of the divider (DIV) 6 responsive to the output signal of the voltage controlled oscillator (VCO) 8 of the PLL respectively coincide with the phase and frequency of the corresponding reference signal Fref, thereby enabling a lock operation of the PLL.

Thus, the calibration of the offset frequency adjustment signal O of the voltage controlled oscillator (VCO) 8 in the PLL and the calibration of the frequency control sensitivity adjustment signal T can be executed by the calibration operation shown in FIG. 9. Incidentally, the value of the first reference voltage $V_{REF1}$ and the value of the second reference voltage $V_{REF2}$ are set extremely close to the value of the control voltage Vc supplied from the loop filter (LP) 3 to the voltage controlled oscillator for the PLL lock operation during the normal operating period of the PLL. Namely, the frequency fvco of the output signal (Fvco) of the voltage controlled oscillator (VCO) 8 during the normal operating period of the PLL according to the second embodiment of the present invention shown in FIG. 8 is given in a relational expression of fvco=N*fref assuming that the division ratio of the divider (DIV) 6 is N and the frequency of the reference signal Fref is fref. Thus, the first reference voltage $V_{REF1}$ and the second reference voltage $V_{REF2}$ each set extremely close to the value of such a control voltage Vc as to obtain the oscillation output signal (Fvco) having the frequency fvco given in this relational expression, are supplied to the voltage controlled oscillator 8 during the period of the calibration operation.

As is understood from FIG. 11, the calibration operation of the PLL according to the second embodiment of the present invention is of a method for accurately adjusting the frequency control sensitivity of the voltage controlled oscillator (VCO) 8 between the first reference voltage $V_{REF1}$ and the second reference voltage $V_{REF2}$ each set extremely close to the value of the control voltage Vc supplied during the normal operating period of the PLL.

In contrast to this, although the calibration operation of the PLL according to the first embodiment of the present invention is relatively simple, it is not possible to compensate for fluctuations in the AC frequency control sensitivity due to fluctuations in the threshold voltage Vthn of the N channel MOS transistor 812 supplied with the control voltage Vc at the voltage-current converter (VIC) 81 shown in FIG. 3 as is understood from FIG. 7.

On the other hand, since the relationship of N3−N2>C is maintained between the first reference voltage $V_{REF1}$ and the second reference voltage $V_{REF2}$ as shown in FIG. 11 in the calibration operation of the PLL according to the second embodiment of the present invention, it is possible to compensate for the fluctuations in the AC frequency control sensitivity. Namely, it is possible to compensate for the fact that the AC frequency control sensitivity has the value of Kv=C/($V_{REF2}$−$V_{REF1}$) between the first reference voltage $V_{REF1}$ and the second reference voltage $V_{REF2}$.

Third Embodiment

FIG. 12 is a diagram showing a configuration of a PLL built in a semiconductor integrated circuit according to a third embodiment of the present invention.

The PLL shown in FIG. 12 is different from the PLL shown in FIG. 1 in that the function of selection of a selector (SEL) 7 is changed in such a manner that it selects a first reference voltage $V_{REF1}$ and a second reference voltage $V_{REF2}$ without causing the selector (SEL) 7 to select the ground potential GND and the reference voltage $V_{REF}$ as the output control voltage Vc in response to the selection signals S="1" and "2".

Further, in the PLL shown in FIG. 12, three adjustment signals T, L and G are supplied from a calibration adjustment unit (LOGIC) 9 to a voltage controlled oscillator (VCO) 8 without the voltage controlled oscillator (VCO) 8 being supplied with the frequency control sensitivity adjustment signal T and the offset frequency adjustment signal O as in the case of the PLL shown in FIG. 1. Correspondingly, a configuration of the voltage controlled oscillator (VCO) 8 of the PLL shown in FIG. 12 is also changed.

FIG. 13 is a diagram showing the configuration of the voltage controlled oscillator (VCO) 8 included in the PLL according to the third embodiment of the present invention shown in FIG. 12.

The voltage controlled oscillator (VCO) 8 shown in FIG. 13 also comprises a voltage-current converter (VIC) 81 and a current controlled oscillator (CCO) 52 in a manner similar to the voltage controlled oscillator (VCO) 5 shown in FIG. 2. The current controlled oscillator (CCO) 52 configured as a ring oscillator comprises delays of odd-numbered stages 521, 522 and 523 identical in configuration to the current controlled oscillator (CCO) 52 shown in FIG. 2.

The voltage-current converter (VIC) 81 whose input terminal is supplied with a control voltage (Vc) for controlling the oscillation frequency of the voltage controlled oscillator (VCO) 8 shown in FIG. 13 can be supplied with adjustment signals T, L and G from the calibration adjustment unit (LOGIC) 9.

Figure 14:
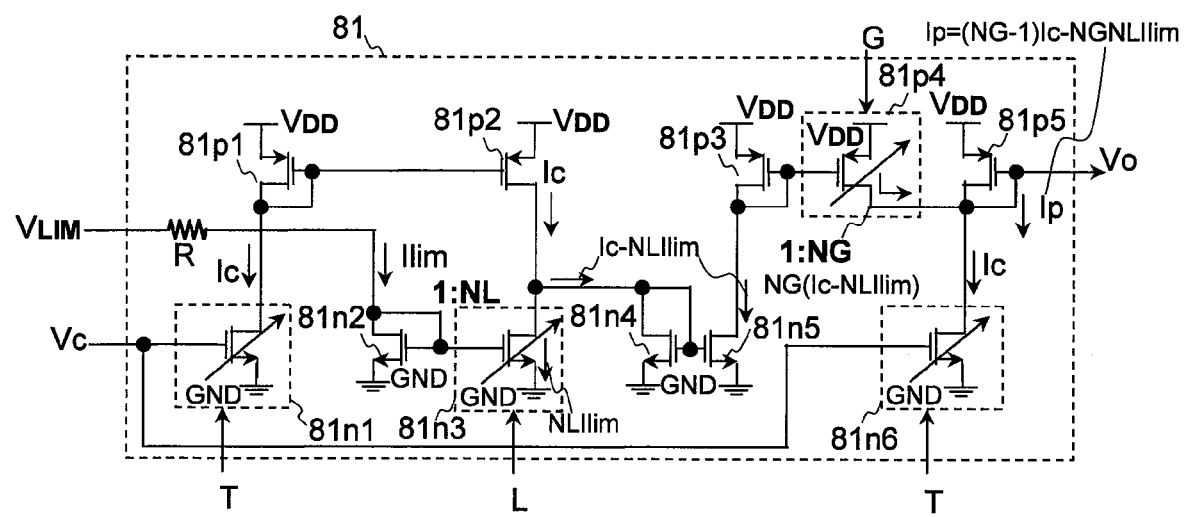
FIG. 14 is a diagram illustrating a configuration of a voltage-current converter included in the voltage controlled oscillator shown in FIG. 13.

FIG. 14 is a diagram showing a configuration of the voltage-current converter (VIC) 81 included in the voltage controlled oscillator (VCO) 8 shown in FIG. 13. The configuration of the voltage-current converter (VIC) 81 shown in FIG. 14 is equivalent to one noticeably changed from the configuration of the voltage-current converter (VIC) 81 shown in FIG. 3.

Namely, the voltage-current converter (VIC) 81 shown in FIG. 14 comprises five P channel MOS transistors 81p1 through 81p5 and six N channel MOS transistors 81n1 through 81n6. The control voltage Vc is supplied to gates of the two N channel MOS transistors 81n1 and 81n6 in parallel. The gains and drain currents Ic of the two N channel MOS transistors 81n1 and 81n6 can be adjusted by the adjustment signal T.

The N channel MOS transistor 81n2 diode-coupled by coupling its gate and drain is supplied with a reference current Ilim whose current value is set by a resistor R, from a reference voltage $V_{LIM}$. A gate of the N channel MOS transistor 81n3 is coupled to its corresponding gate and drain of the N channel MOS transistor 81n2 so as to configure a current mirror along with the diode-coupled N channel MOS transistor 81n2. The gain and drain current of the N channel MOS transistor 81n3 can be adjusted by the adjustment signal L. A drain of the N channel MOS transistor 81n3 is supplied with the drain current Ic of the N channel MOS transistor 81n1 via a current mirror configured by the two P channel MOS transistors 81p1 and 81p2.

The N channel MSO transistor 81n4 diode-coupled by its gate-drain coupling is coupled to its corresponding drain of the N channel MOS transistor 81n3. A current corresponding to a difference between the drain current of the P channel MOS transistor 81p2 and the drain current of the N channel MOS transistor 81n3 flows into the diode-coupled N channel MOS transistor 81n4. A gate of the N channel MOS transistor 81n5 is coupled to its corresponding gate and drain of the N channel MOS transistor 81n4 so as to configure a current mirror along with the diode-coupled N channel MOS transistor 81n4.

A drain current of the N channel MOS transistor 81n5 is supplied to its corresponding drain of the N channel MOS transistor 81n6 via a current mirror configured by the two P channel MOS transistors 81p3 and 81p4. The gain and drain current of the P channel MOS transistor 81p4 can be adjusted by the adjustment signal G. The P channel MOS transistor 81p5 diode-coupled by its gate-drain coupling is coupled between the drain of the N channel MOS transistor 81n6 and a source voltage $V_{DD}$. A control current Ip that flows through the diode-coupled P channel MOS transistor 81p5 becomes a current corresponding to a difference between the drain current of the P channel MOS transistor 81p4 and the drain current of the N channel MOS transistor 81n6. This difference current is converted to an output voltage Vp by the diode-coupled P channel MOS transistor 81p5. The output voltage Vp is supplied to the delays 521, 522 and 523 of the current controlled oscillator (CCO) 52 of the voltage controlled oscillator (VCO) 8 as a bias voltage, so that respective operating currents and delay times of the delays 521, 522 and 523 are set, thereby determining the oscillation frequency of the voltage controlled oscillator (VCO) 8.

The operation of the voltage-current converter (VIC) 81 shown in FIG. 14 will next be described.

The drain current Ic of the N channel MOS transistor 81n1 whose gate is supplied with the control voltage Vc is supplied to the drain of the N channel MOS transistor 81n3 via a current mirror having a current mirror ratio of 1:1, which has been configured by the two P channel MOS transistors 81p1 and 81p2. On the other hand, since the current mirror ratio between the N channel MOS transistors 81n2 and 81n3 is set to 1:NL, the drain current of the N channel MOS transistor 81n3 becomes NL*Ilim. Thus, the current Ic−NL*Ilim corresponding to the difference between the drain current Ic of the P channel MOS transistor 81p2 and the drain current NL*Ilim of the N channel MOS transistor 81n3 flows into the diode-coupled N channel MOS transistor 81n4.

Since the current mirror ratio between the N channel MOS transistors 81n4 and 81n5 is set to 1:1, the drain current of the N channel MOS transistor 81n5 is brought to Ic−NL*Ilim. On the other hand, since the current mirror ratio between the P channel MOS transistors 81p3 and 81p4 is set to 1:NG, the drain current of the P channel MOS transistor 81p4 becomes NG*(Ic−NL*Ilim). The drain current Ic flows through the N channel MOS transistor 81n6 whose gate is supplied with the control voltage Vc. Thus, the control current Ip that flows through the diode-coupled P channel MOS transistor 81p5 is brought to the current (NG−1)*Ic−NL*Ilim corresponding to the difference between the drain current NG*(Ic−NL*Ilim) of the P channel MOS transistor 81p4 and the drain current Ic of the N channel MOS transistor 81n6.

FIG. 35 is a diagram showing the dependence of the control current Ip flowing through the P channel MOS transistor 81p5 on the control voltage Vc at the voltage-current converter (VIC) 81 shown in FIG. 14.

Since the two N channel MOS transistors 81n1 and 81n6 are off when the control voltage Vc is lower in level than the threshold voltages Vthn of the two N channel MOS transistors 81n1 and 81n6 whose gates are supplied with the control voltage Vc, their drain currents Ic are zero. On the other hand, since the gates of the N channel MOS transistors 81n4 and 81n5 configuring the current mirror are pulled down to the ground potential GND by the drain current NL*Ilim of the N channel MOS transistor 81n3, the drain current of the N channel MSO transistor 81n5 also becomes zero. Thus, since the drain currents of the P channel MOS transistors 81p3 and 81p4 that configure the current mirror are also brought to zero, the control current Ip that flows through the diode-coupled P channel MOS transistor 81p5 also becomes zero.

When the threshold voltages Vthn of the N channel MOS transistors 81n1 and 81n6 and the control voltage Vc become equal to each other, the N channel MOS transistors 81n1 and 81n6 are turned on so that their drain currents Ic become a small value respectively. Thus, since the drain currents Ic of the P channel MOS transistors 81p1 and 81p2 also become a small value respectively, the drain current NL*Ilim of the N channel MOS transistor 81n3 becomes a value larger than the small drain current Ic of the P channel MSO transistor 81p2. As a result, the gates of the N channel MSO transistors 81n4 and 81n5 are pulled down to the ground potential GND so that the drain current of the N channel MOS transistor 81n5 also becomes zero. Thus, since the drain currents of the P channel MOS transistors 81p3 and 81p4 also become zero, the control current Ip that flows through the diode-coupled P channel MOS transistor 81p5 is determined by the small drain current Ic of the N channel MOS transistor 81n6. In this case, the dependence of the drain current Ic of the N channel MOS transistor 81n6 and the control current Ip flowing through the P channel MOS transistor 81p5 on the control voltage Vc can be adjusted by the value of the adjustment signal T. Since the conductances gm of the N channel MOS transistors 81n1 and 81n6 also become large as the value of the adjustment signal T becomes large, the value of the drain current Ic of the N channel MOS transistor 81n6 and the value of the control current Ip flowing through the P channel MOS transistor 81p5 also increase.

When the control voltage Vc increases than the values of the N channel MOS transistors 81n1 and 81n6, the degrees of conduction of the N channel MOS transistors 81n1 and 81n6 increase and their drain currents Ic also increase. Accordingly, the drain currents Ic of the P channel MOS transistors 81p1 and 81p2 also increase and the drain current Ic of the P channel MOS transistor 81p2 increases than the drain current NL*Ilim of the N channel MOS transistor 81n3. As a result, the current Ic−NL*Ilim corresponding to the difference between the drain current Ic of the P channel MOS 81p2 and the drain current NL*Ilim of the N channel MOS transistor 81n3 flows into the N channel MOS transistors 81n4 and 81n5.

The control current Ip that flows through the diode-coupled P channel MOS transistor 81p5 is set by the difference current (NG−1)*Ic−NL*Ilim between the drain current of NG*(Ic−NL*Ilim) from the P channel MOS transistor 81p4 of the P channel MOS transistors 81p3 and 81p4 in which the current mirror ratio is set to 1:NG, and the drain current Ic of the N channel MOS transistor 81n6.

The value NG of the current mirror ratio 1:NG between the P channel MOS transistors 81p3 and 81p4 of the voltage-current converter (VIC) 81 shown in FIG. 14 can be adjusted by the adjustment signal G. As the value of the adjustment signal G increases, the value of NG also increases and the control current Ip flowing through the diode-coupled P channel MOS transistor 81p5 also increases. Assuming that the adjustment signal G and the value NG are equal to each other, the value of the control current Ip becomes constant with respect to an increase in the control voltage Vc where the value of NG is 1, without increasing the control current Ip with the increase in the control voltage Vc. When the adjustment signal G and the value of NG are 2 or more, the control current IP increases with the increase in the control voltage Vc.

The value NL of the current mirror ratio 1:NL between the N channel MOS transistors 81n2 and 81n3 of the voltage-current converter (VIC) 81 shown in FIG. 14 can be set by the adjustment signal L. Assuming that the adjustment signal L and the value NL are equal to each other, the value of NL also increases as the value of the adjustment signal L increases, and hence the value of the drain current NL*Ilim of the N channel MOS transistor 81n3 also increases. After doing so, the level of the control current Ip flowing through the diode-coupled P channel MOS transistor 81p5, which has been determined by the difference current (NG−1)*Ic−NL*Ilim, is also reduced with the increases in the value of the adjustment signal L and the value of NL.

FIG. 15 is a diagram for describing a calibration operation of the PLL according to the third embodiment of the present invention shown in FIGS. 12 through 14.

When the calibration operation of the PLL shown in FIG. 15 is started, the selection signal S becomes S="1" at Step 150. Therefore, the selector (SEL) 7 of the PLL shown in FIG. 12 selects an input first reference voltage $V_{REF1}$ as an output control voltage Vc. Since, at this time, a phase frequency detector (PFD) 1 and a charge pump (CP) 2 are respectively controlled to a standby state by a control signal R high in level, the PLL is controlled to an open loop. At this time, the adjustment signal T and the adjustment signal L are respectively set to T="0" and L=maximum value "MAX", and the values of the adjustment signal G and the value NG are set to "1". In this initial state, the calibration adjustment unit (LOGIC) 9 starts counting a divided signal of an output signal (Fvco) of the voltage controlled oscillator (VCO) 8 by a divider (DIV) 6 at Step 151.

The calibration adjustment unit (LOGIC) 9 compares a count result N1 of the output signal (Fvco) with a target value A at Step 152. Incidentally, the target value A corresponds to a lowest oscillation frequency corresponding to one target frequency characteristic of the voltage controlled oscillator (VCO) 8. When the calibration adjustment unit (LOGIC) 9 determines that N1 and A are expressed in a relationship of N1<A, it is determined at Step 153 whether the adjustment signal T is of the maximum value "MAX". When it is determined at Step 153 that the adjustment signal T is not brought to the maximum value "MAX", the calibration adjustment unit (LOGIC) 9 updates the adjustment signal T to T=T+1 at Step 154. When it is determined at Step 153 that the adjustment signal T corresponds to the maximum value MAX, it is determined at Step 155 whether the adjustment signal L corresponds to the minimum value "MINI". When it is determined at Step 155 that the adjustment signal L does not assume the minimum value "MINI", the calibration adjustment unit (LOGIC) 9 updates the adjustment signal L to L=L−1 at Step 156 and updates the adjustment signal T to an initial value "0". When it is determined at Step 155 that the adjustment signal L assumes the minimum value "MINI", an error state is displayed at Step 157 and the calibration operation is completed.

The frequency of the output signal (Fvco) of the voltage controlled oscillator (VCO) 8 increases in response to the control voltage Vc corresponding to the first reference voltage $V_{REF1}$ selected by the selector (SEL) 7 and the updated adjustment signals T and L. There is a possibility that an increase in the frequency of the output signal (Fvco) will be insufficient at first and the determination as to the relationship of N1<A will continue at Step 152. There is a possibility that the determination at Step 153 that the adjustment signal T does not assume the maximum value MAX, the updating of the adjustment signal T at Step 154 and the adjustment signal L at Step 156 will continue. However, the increase in the frequency of the output signal (Fvco) becomes sufficient gradually and the relationship of N1>A is determined at Step 153.

FIG. 16 is a diagram showing the manner in which the oscillation frequency of an output signal (Fvco) of the voltage controlled oscillator (VCO) 8 increases in response to the updating of an adjustment signal T and an adjustment signal L and the updating of an adjustment signal T and an adjustment signal L in the calibration operation of the PLL according to the third embodiment of the present invention shown in FIGS. 12 through 15.

Since a relationship of N1>A targeted when the adjustment signal L is "1" and the adjustment signal T is "0" is first determined in the example of FIG. 16, the final updated value of the adjustment signal L is set to "1" and the final updated value of the adjustment signal T is set to "0". Namely, at Step 158, the calibration adjustment unit (LOGIC) 9 sets the adjustment signal L to the final updated value "1" (L=L@N1>A hold) and sets the adjustment signal T to the final updated value "0" (T=T@N1>A hold).

In this condition, the calibration adjustment unit (LOGIC) 9 starts counting a divided signal of the output signal (Fvco) of the voltage controlled oscillator (VCO) 8 by the divider (DIV) 6 at Step 159 and stores a count result N2 in a built-in memory of the semiconductor integrated circuit.

Next, the calibration adjustment unit (LOGIC) 9 changes the selection signal S from S="1" to S="2" at Step 1510. In doing so, the selector (SEL) 7 of the PLL shown in FIG. 12 switches the input first reference voltage $V_{REF1}$ to a second reference voltage $V_{REF2}$ slightly higher in level than it as the output control voltage Vc in response to the change of the selection signal S from S="1" to S="2". The frequency of the output signal (Fvco) of the voltage controlled oscillator (VCO) 8 slightly increases in response to the change of the control voltage Vc supplied to the voltage controlled oscillator (VCO) 8 from the first reference voltage $V_{REF1}$ to the second reference voltage $V_{REF2}$. In this state, the calibration adjustment unit (LOGIC) 9 starts counting a divided signal of the output signal (Fvco) of the voltage controlled oscillator (VCO) 8 by the divider (DIV) 6 at Step 1510 and stores a count result N3 in the built-in memory of the semiconductor integrated circuit.

Next, at Step 1511, the calibration adjustment unit (LOGIC) 9 compares the count result N3 of the output signal (Fvco) with a target value B and further compares a difference N3−N2 between the count result N3 and the count result N2 with a target value C. Incidentally, the target value B and the target value C respectively correspond to a VCO oscillation frequency and AC frequency control sensitivity each corresponding to a target frequency characteristic of the voltage controlled oscillator (VCO) 8. The VCO oscillation frequency indicates the oscillation frequency of the voltage controlled oscillator (VCO) 8 where the control voltage Vc is set to a predetermined value, whereas the AC frequency control sensitivity indicates control sensitivity of a width of change in the oscillation frequency of the voltage controlled oscillator (VCO) 8 when the control voltage Vc changes in a predetermined range. When the calibration adjustment unit (LOGIC) 9 determines at Step 1511 that the count result and the target value are expressed in a relationship of N3<B or a relationship of N3−N2<C, the calibration adjustment unit (LOGIC) 9 updates the adjustment signal G to G=G+1 at Step 1512.

The frequency of the output signal (Fvco) of the voltage controlled oscillator (VCO) 8 increases in response to the increase and updating of the adjustment signal G. There is a possibility that an increase in the frequency will be insufficient at first and the determination as to the relationship of N3<B or the relationship of N3−N2<C at Step 1511 will continue. There is a possibility that the updating of the adjustment signal G at Step 1512 will continue. However, the increase in the frequency becomes sufficient gradually and the relationship of N3>B and the relationship of N3−N2>C are determined at Step 1511.

FIG. 17 is a diagram showing the manner in which the frequency of an output signal (Fvco) of the voltage controlled oscillator (VCO) 8 increases in response to the updating of an adjustment signal G in the calibration operation of the PLL according to the third embodiment of the present invention shown in FIGS. 12 through 16.

Since a relationship of N3>B and a relationship of N3−N2>C targeted when the updated value of the adjustment signal G is "2" are first determined in the example of FIG. 17, the final updated value of the adjustment signal G is set to "2". Namely, at Step 1513, the calibration adjustment unit (LOGIC) 9 sets the adjustment signal G to the final updated value "2" (G=G@N3>B and N3−N2>C hold) and restores the selection signal S from S="2" to S="0". Since, at this time, the calibration adjustment unit (LOGIC) 9 restores the control signal R from a high level to a low level, the phase frequency detector (PFD) 1 and the charge pump (CP) 2 are controlled to an active state in response to the control signal R low in level. Therefore, the PLL is controlled to a closed loop. In response to the selection signal S="0", the selector (SEL) 7 switches the input second reference voltage $V_{REF1}$ to the output signal of the loop filter (LP) 3 as the output's control voltage Vc. Thus, the PLL is brought to the normal operating period corresponding to the closed loop, so that the phase and frequency of the output signal of the divider (DIV) 6 responsive to the output signal of the voltage controlled oscillator (VCO) 8 of the PLL respectively coincide with the phase and frequency of the corresponding reference signal Fref, thereby enabling a lock operation of the PLL.

Thus, the calibration of the adjustment signal T, adjustment signal L and adjustment signal G of the voltage controlled oscillator (VCO) 8 in the PLL shown in FIG. 12 can be executed by the calibration operation shown in FIG. 15. Incidentally, the value of the first reference voltage $V_{REF1}$ and the value of the second reference voltage $V_{REF2}$ are set extremely close to the value of the control voltage Vc supplied from the loop filter (LP) 3 to the voltage controlled oscillator for the PLL lock operation during the normal operating period of the PLL. Namely, the frequency fvco of the output signal (Fvco) of the voltage controlled oscillator (VCO) 8 during the normal operating period of the PLL according to the third embodiment of the present invention shown in FIG. 12 is given in a relational expression of fvco=N*fref assuming that the division ratio of the divider (DIV) 6 is N and the frequency of the reference signal Fref is fref. Thus, the first reference voltage $V_{REF1}$ and the second reference voltage $V_{REF2}$ each set extremely close to the value of such a control voltage Vc as to obtain the oscillation output signal (Fvco) having the frequency fvco given in this relational expression, are supplied to the voltage controlled oscillator 8 during the period of the calibration operation.

Even during the calibration operation of the PLL according to the third embodiment of the present invention, the relationship of N3−N2>C is maintained between the first reference voltage $V_{REF1}$ and the second reference voltage $V_{REF2}$. It is possible to compensate for the value of the AC frequency control sensitivity Kv=C/($V_{REF2}$−$V_{REF1}$) between the first reference voltage $V_{REF1}$ and the second reference voltage $V_{REF2}$.

Figure 18:
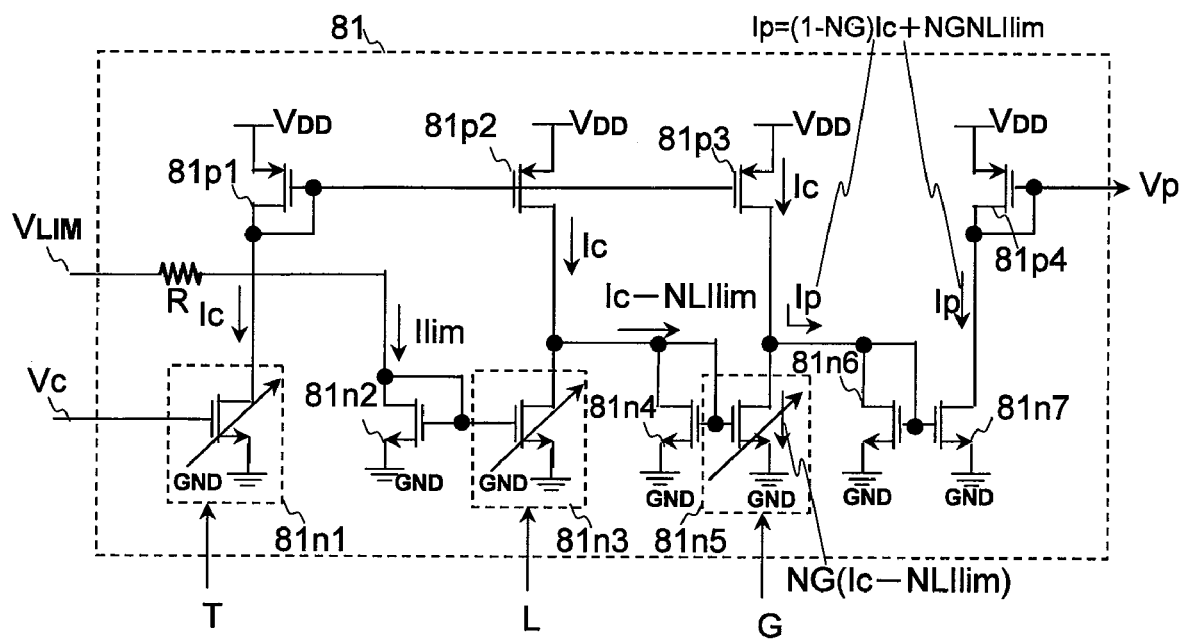
FIG. 18 is a diagram showing another configuration of the voltage-current converter included in the voltage controlled oscillator shown in FIG. 13.

FIG. 18 is a diagram showing another configuration of the voltage-current converter (VIC) 81 included in the voltage controlled oscillator (VCO) 8 shown in FIG. 13.

Namely, the voltage-current converter (VIC) 81 shown in FIG. 18 comprises four P channel MOS transistors 81p1 through 81p4 and seven N channel MOS transistors 81n1 through 81n7. A control voltage Vc is supplied to its corresponding gate of the N channel MOS transistor 81n1. The gain and drain currents Ic of the N channel MOS transistor 81n1 can be adjusted by an adjustment signal T.

The N channel MOS transistor 81n2 diode-coupled by coupling its gate and drain is supplied with a reference current Ilim whose current value is set by a resistor R, from a reference voltage $V_{LIM}$. A gate of the N channel MOS transistor 81n3 is coupled to its corresponding gate and drain of the N channel MOS transistor 81n2 so as to configure a current mirror along with the diode-coupled N channel MOS transistor 81n2. The gain and drain current of the N channel MOS transistor 81n3 can be adjusted by an adjustment signal L. A drain of the N channel MOS transistor 81n3 is supplied with the drain current Ic of the N channel MOS transistor 81n1 via the two P channel MOS transistors 81p1 and 81p2 that configure a current mirror. Further, a current mirror configured by the two N channel MOS transistors 81n4 and 81n5 is coupled to the drain of the N channel MOS transistor 81n3. A gain and drain current of the N channel MOS transistor 81n5 can be adjusted by an adjustment signal G.

A drain of the N channel MOS transistor 81n5 is supplied with the drain current Ic of the N channel MOS transistor 81n1 via the two P channel MOS transistors 81p1 and 81p3 that configure a current mirror. Further, a current mirror configured by the tow N channel MOS transistors 81n6 and 81n7 is coupled to the drain of the N channel MOS transistor 81n5. The P channel MOS transistor 81p4 diode-coupled by its gate-drain coupling is coupled between a drain of the N channel MOS transistor 81n7 and a source voltage $V_{DD}$.

A control current Ip that flows through the P channel MOS transistor 81p4 diode-coupled to the diode-coupled N channel MOS transistor 81n6 becomes a current corresponding to the difference between a drain current of the P channel MOS transistor 81p3 and the drain current of the N channel MOS transistor 81n5. The difference current is converted to its corresponding output voltage Vp by the diode-coupled P channel MOS transistor 81p4. The output voltage Vp is supplied to the delays 521, 522 and 523 of the current controlled oscillator (CCO) 52 of the voltage controlled oscillator (VCO) 8 shown in FIG. 13 as a bias voltage, so that respective operating currents and delay times of the delays 521, 522 and 523 are set. Therefore, the oscillation frequency of the voltage controlled oscillator (VCO) 8 is determined.

The operation of the voltage-current converter (VIC) 81 shown in FIG. 18 will next be described.

The drain current Ic of the N channel MOS transistor 81n1 whose gate is supplied with the control voltage Vc is supplied to the drain of the N channel MOS transistor 81n3 via a current mirror having a current mirror ratio of 1:1, which has been configured by the two P channel MOS transistors 81p1 and 81p2. On the other hand, since the current mirror ratio between the N channel MOS transistors 81n2 and 81n3 is set to 1:NL, the drain current of the N channel MOS transistor 81n3 becomes NL*Ilim. Thus, the current Ic−NL*Ilim corresponding to the difference between the drain current Ic of the P channel MOS transistor 81p2 and the drain current NL*Ilim of the N channel MOS transistor 81n3 flows into the diode-coupled N channel MOS transistor 81n4.

Since the current mirror ratio between the N channel MOS transistors 81n4 and 81n5 is set to 1:NG, the drain current of the N channel MOS transistor 81n5 is brought to NG(Ic−NL*Ilim).

On the other hand, since the drain current Ic is flowing through the P channel MOS transistor 81p3, the value of the difference current flowing into the diode-coupled N channel MOS transistor 81n4 becomes (1−NG)*Ic+NL*Ilim. Thus, the value of the difference current becomes the control current Ip that flows through the diode-coupled P channel MOS transistor 81p4.

The calibration operation of the PLL according to the third embodiment of the present invention shown in FIG. 15 is modified in the following manner corresponding to the voltage-current converter (VIC) 81 shown in FIG. 18.

At Step 150, the adjustment signal T and the adjustment signal L are respectively set to T="0" and L="0", and the adjustment signal G and the value of the value NG are respectively set to "0". It is determined at Step 155 whether the adjustment signal L is of the minimum value "MINI". The adjustment signal L is updated to L=L−1 at Step 156, and the adjustment signal G is updated to G=G−1 at Step 1512. Incidentally, the gain and drain current of the N channel MOS transistor 81n5 in the current mirror type N channel MOS transistors 81n4 and 81n5 decrease with an increase in the value of the adjustment signal G, the value NG becomes a negative value. Since the gain and drain current of the N channel MOS transistor 81n3 in the current mirror type transistors 81n2 and 81n3 decrease with an increase in the value of the adjustment signal L, the value NL also becomes a negative value.

Fourth Embodiment

Figure 21:
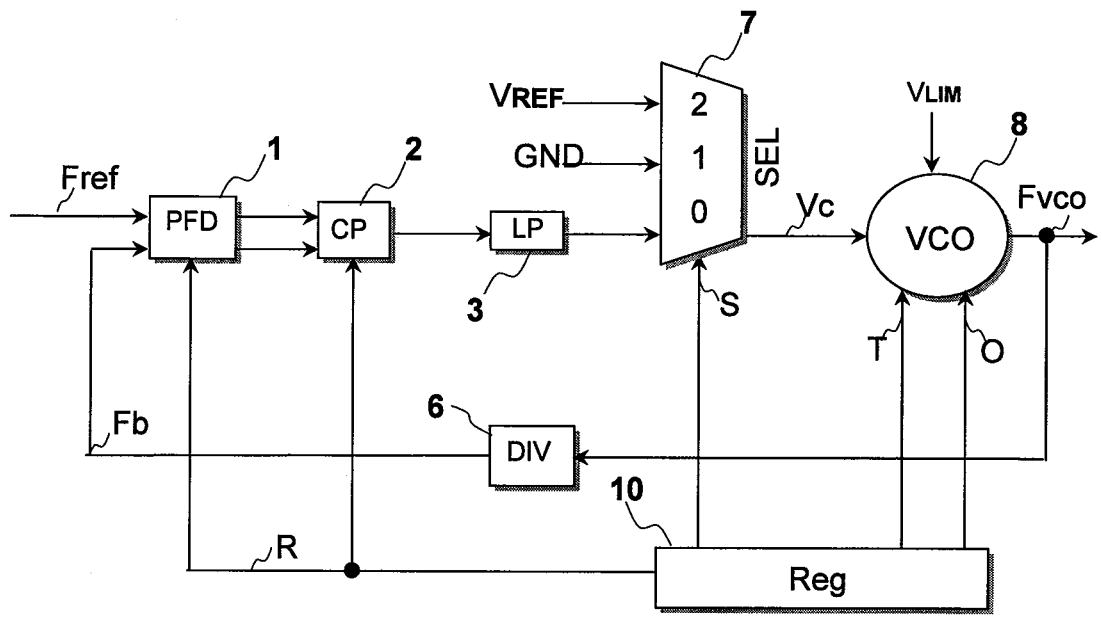
FIG. 21 is a diagram showing a configuration of a PLL built in a semiconductor integrated circuit according to a fourth embodiment of the present invention.

FIG. 21 is a diagram showing a configuration of a PLL built in a semiconductor integrated circuit according to a fourth embodiment of the present invention.

The PLL shown in FIG. 21 differs from the PLL according to the first embodiment of the present invention shown in FIG. 1 in that the calibration adjustment unit 9 included in the PLL of FIG. 1 is replaced with a register (Reg) 10 in the PLL shown in FIG. 21.

Even at the PLL shown in FIG. 21 in a manner similar to the PLL according to the first embodiment of the present invention described in FIGS. 1 through 7, FIG. 19 and FIGS. 32 and 33, the frequency characteristic of a voltage controlled oscillator (VCO) 8 is adjusted so as to assume a desired characteristic by its calibration operation.

Although not shown in the semiconductor integrated circuit shown in FIG. 21, a central processing unit (CPU) for executing the same calibration operation as that according to the first embodiment of the present invention is included therein. The central processing unit (CPU) supplies a frequency control sensitivity adjustment signal T, an offset frequency adjustment signal O, a selection signal S and a control signal R from the register (Reg) 10 to the PLL in such a manner that the frequency characteristic of the voltage controlled oscillator (VCO) 8 included in the PLL of FIG. 21 assumes the desired characteristic. Thus, the register (Reg) 10 comprises a plurality of control registers which store therein respective control data about the frequency control sensitivity adjustment signal T, offset frequency adjustment signal O, selection signal S and control signal R. The central processing unit (CPU) updates the control data of the register (Reg) 10 in accordance with control steps for the same calibration operation as that for the first embodiment.

Fifth Embodiment

Figure 22:
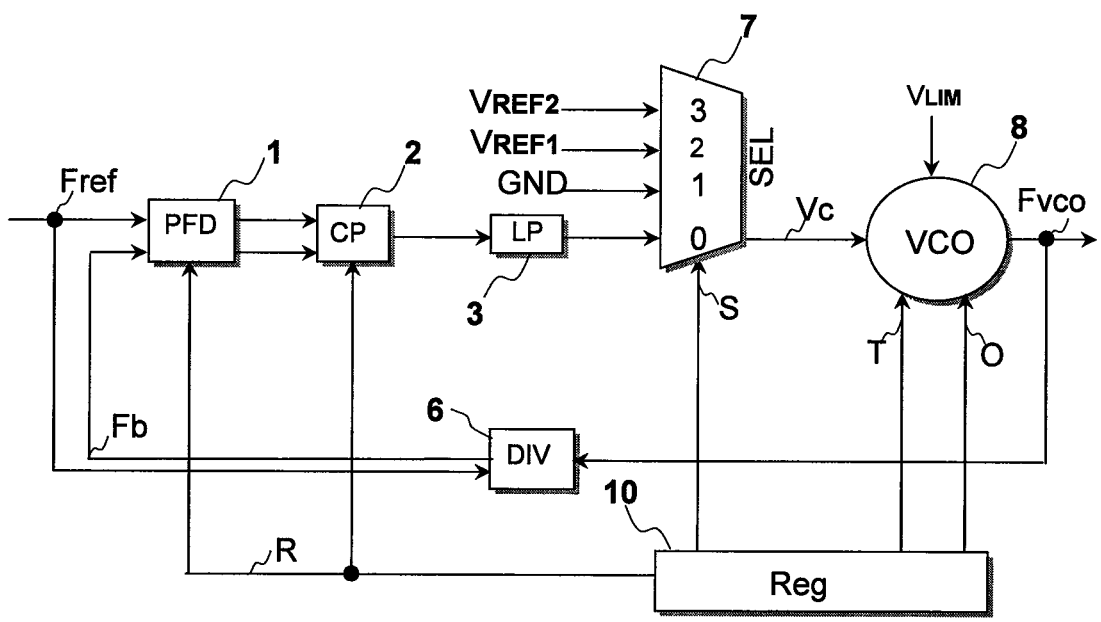
FIG. 22 is a diagram illustrating a configuration of a PLL built in a semiconductor integrated circuit according to a fifth embodiment of the present invention.

FIG. 22 is a diagram showing a configuration of a PLL built in a semiconductor integrated circuit according to a fifth embodiment of the present invention.

The PLL shown in FIG. 22 differs from the PLL according to the second embodiment of the present invention shown in FIG. 8 in that the calibration adjustment unit 9 included in the PLL of FIG. 8 is replaced with a register (Reg) 10 in the PLL shown in FIG. 22.

Even at the PLL shown in FIG. 22 in a manner similar to the PLL according to the second embodiment of the present invention described in FIGS. 8 through 11, the frequency characteristic of a voltage controlled oscillator (VCO) 8 is adjusted so as to assume a desired characteristic by a calibration operation.

Although not illustrated in the semiconductor integrated circuit shown in FIG. 22, a central processing unit (CPU) for executing the same calibration operation as that according to the first embodiment of the present invention is included therein. The central processing unit (CPU) supplies a frequency control sensitivity adjustment signal T, an offset frequency adjustment signal O, a selection signal S and a control signal R from the register (Reg) 10 to the PLL in such a manner that the frequency characteristic of the voltage controlled oscillator (VCO) 8 included in the PLL of FIG. 22 assumes the desired characteristic. Thus, the register (Reg) 10 comprises a plurality of control registers which store therein respective control data about the frequency control sensitivity adjustment signal T, offset frequency adjustment signal O, selection signal S and control signal R. The central processing unit (CPU) updates the control data of the register (Reg) 10 in accordance with control steps for the same calibration operation as that for the first embodiment.

Sixth Embodiment

Figure 23:
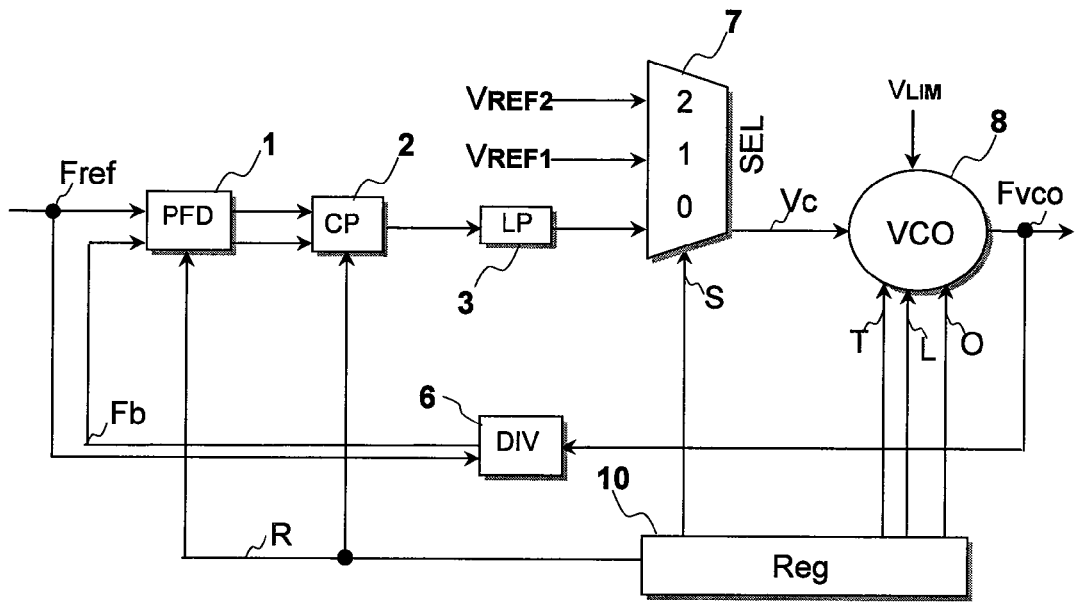
FIG. 23 is a diagram depicting a configuration of a PLL built in a semiconductor integrated circuit according to a sixth embodiment of the present invention.

FIG. 23 is a diagram showing a configuration of a PLL built in a semiconductor integrated circuit according to a sixth embodiment of the present invention.

The PLL shown in FIG. 23 differs from the PLL according to the third embodiment of the present invention shown in FIG. 12 in that the calibration adjustment unit 9 included in the PLL of FIG. 12 is replaced with a register (Reg) 10 in the PLL shown in FIG. 23.

Even at the PLL shown in FIG. 23 in a manner similar to the PLL according to the third embodiment of the present embodiment described in FIGS. 12 through 18, the frequency characteristic of a voltage controlled oscillator (VCO) 8 is adjusted so as to assume a desired characteristic by a calibration operation.

Although not illustrated in the semiconductor integrated circuit shown in FIG. 23, a central processing unit (CPU) for executing the same calibration operation as that according to the first embodiment of the present invention is included therein. The central processing unit (CPU) supplies an adjustment signal T, an adjustment signal L, an adjustment signal G, a selection signal S and a control signal R from the register (Reg) 10 to the PLL in such a manner that the frequency characteristic of the voltage controlled oscillator (VCO) 8 included in the PLL of FIG. 23 assumes the desired characteristic. Thus, the register (Reg) 10 comprises a plurality of control registers which store therein respective control data about the adjustment signal T, adjustment signal L, adjustment signal G, selection signal S and control signal R. The central processing unit (CPU) updates the control data of the register (Reg) 10 in accordance with control steps for the same calibration operation as that for the first embodiment.

Seventh Embodiment

FIG. 31 is a diagram showing a configuration of a PLL built in a semiconductor integrated circuit according to a seventh embodiment of the present invention.

The PLL shown in FIG. 31 differs from the PLL according to the first embodiment of the present invention shown in FIG. 1 in that the charge pump (CP) 2 included in the PLL of FIG. 1 is replaced with a first charge pump (CPM) 2a and a second charge pump (CPS) 2b. A loop filter (LP) 3 of the PLL shown in FIG. 31 comprises a resistor R1 and a capacitor C1 for determining a zero point frequency f1. A frequency f2 is mainly determined by the resistor R1, capacitor C1 and capacitor C2. Incidentally, the loop filter (LP) 3 includes a low pass filter comprised of a resistor R2 and a capacitor C3.

In the PLL shown in FIG. 31, an up output signal UP of a phase frequency detector (PFD) 1 is supplied to a charge control input terminal of the first charge pump (CPM) 2a and a discharge control input terminal of the second charge pump (CPS) 2b. A down output signal DN of the phase frequency detector (PFD) 1 is supplied to a discharge control input terminal of the first charge pump (CPM) 2a and a charge control input terminal of the second charge pump (CPS) 2b. Accordingly, the first charge pump (CPM) 2a and the second charge pump (CPS) 2b are driven in antiphase to each other in response to the up output signal UP and the down output signal DN of the phase frequency detector (PFD) 1.

Further, a ratio $\beta$ (i2/i1) between a charge/discharge current i1 of the first charge pump (CPM) 2a and a charge/discharge current i2 of the second charge pump (CPS) 2b is set to a predetermined value such as 0.9 or the like. When the zero point frequency f1 is set by the resistor R1 and capacitor C1 of the loop filter (LP) 3, the zero point frequency f1 is set by a relational expression for dividing a time constant C1R1 by the ratio $\beta$.

Thus, since the capacitor C1 small in capacitance value can be used when the zero point frequency f1 of the same value is set, the loop filter (LP) 3 can easily be built in a semiconductor chip of the semiconductor integrated circuit. Incidentally, since the PLL which includes the first and second charge pumps and makes it easy to build the loop filter in the semiconductor integrated circuit, has been described in Japanese Unexamined Patent Publication No. 2005-184771, refer to it.

Figure 28:
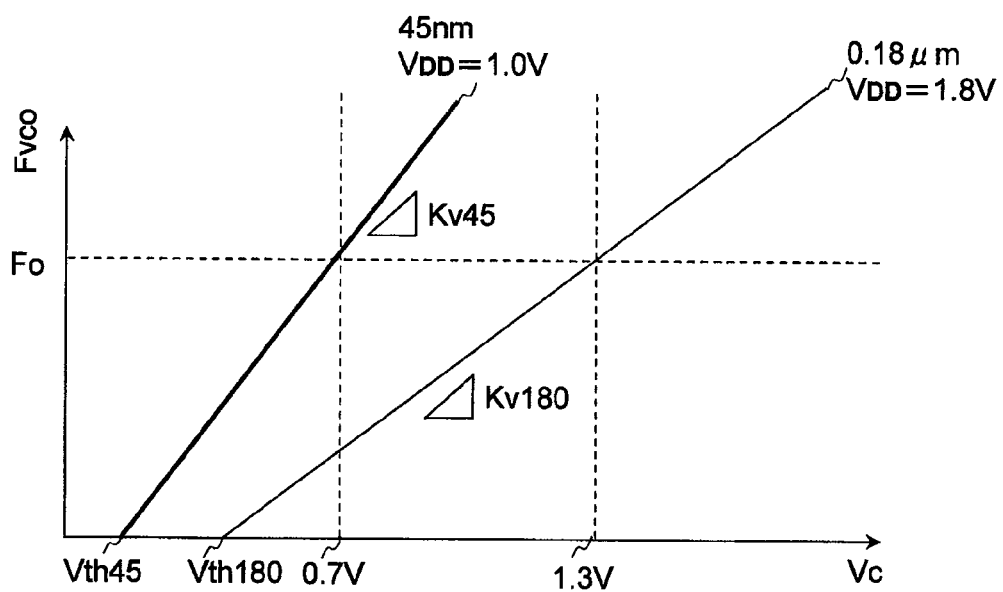
FIG. 28 is a diagram showing the characteristics of frequency control sensitivity of oscillation frequency vs control voltages of the voltage controlled oscillator shown in FIG. 26, which has been examined by the present inventors et al. prior to the present invention.
Figure 29:
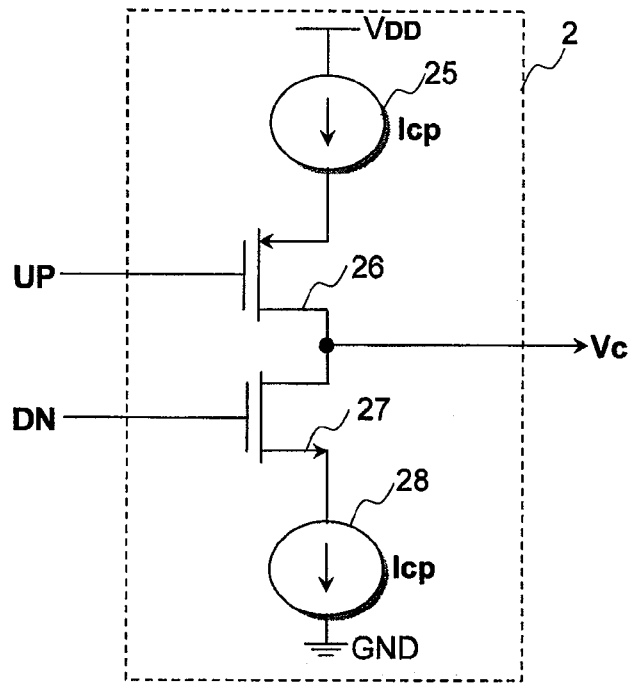
FIG. 29 is a diagram depicting a configuration of a charge pump examined by the present inventors et al. prior to the present invention.
Figure 30:
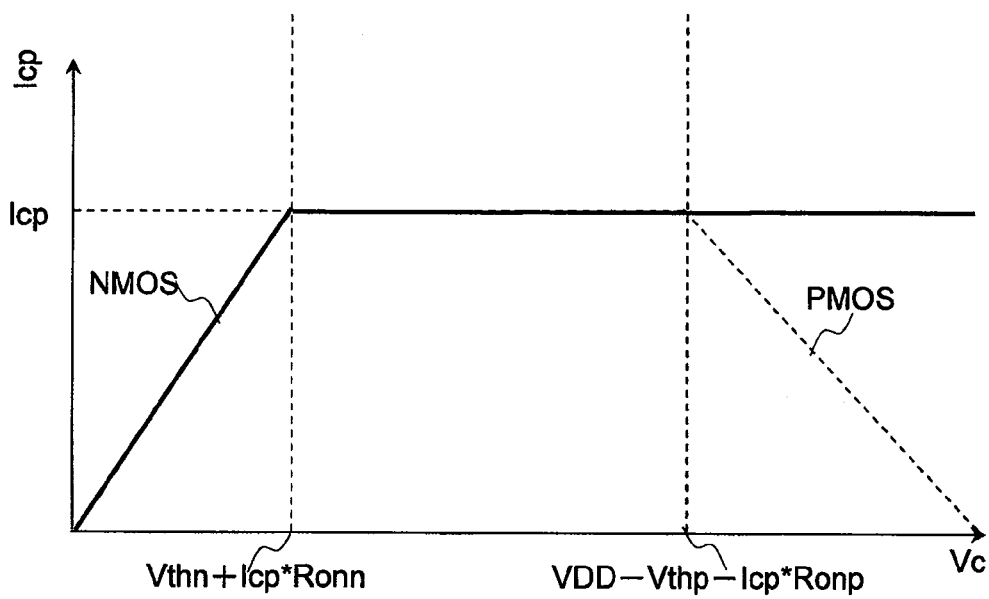
FIG. 30 is a diagram showing the relationship between currents flowing through a charging current source and a discharging current source at the charge pump shown in FIG. 29 and a control voltage at an output terminal of the charge pump.

The first charge pump (CPM) 2a and the second charge pump (CPS) 2b of the PLL shown in FIG. 31 respectively have such characteristics as shown in FIG. 30 as described at the commencement of the specification. Thus, the jitter characteristic of a voltage controlled oscillator (VCO) in the PLL shown in FIG. 31 must be taken into consideration in terms of an increase in the frequency control sensitivity Kv due to the miniaturized CMOS manufacturing process shown in FIG. 28 and an increase in the frequency control sensitivity Kv at the characteristic of the charge pump 2, which has been shown approximately in the central part of FIG. 30.

Thus, even at the PLL shown in FIG. 31, the frequency characteristic of the voltage controlled oscillator (VCO) 8 is adjusted to assume a desired characteristic by a calibration operation in a manner similar to the PLL according to the first embodiment of the present invention described in FIGS. 1 through 7, FIG. 19 and FIGS. 32 and 33.

Further, the PLL shown in FIG. 31 operates as a fractional PLL by using, as a divider 6, a $\Sigma\Delta$ modulator in which an average division ratio assumes a value equal to or less than a decimal fraction by regularly changing the division ratio to a division ratio N and a different division ratio N+1. In the fractional PLL, the noise spectrum of the PLL increases since quantization noise of the $\Sigma\Delta$ modulator used as the divider 6 passes through a PLL's band.

Even when the PLL shown in FIG. 31 is configured as the fractional PLL in this way, the frequency control sensitivity Kv of the voltage controlled oscillator (VCO) 8 is adjusted to assume a desired characteristic by a calibration operation in a manner similar to the first embodiment of the present invention referred to above. It is thus possible to reduce degradation in the noise spectrum of the fractional PLL due to the quantization noise of the $\Sigma\Delta$ modulator used as the divider 6.

Eighth Embodiment

FIG. 24 is a diagram showing a configuration of an optical disk apparatus equipped with a semiconductor integrated circuit according to an eighth embodiment of the present invention.

The semiconductor integrated circuit 241 according to the eighth embodiment shown in FIG. 24 has the PLL built therein according to each of the first through seventh embodiments of the present invention. The PLL generates clock signals to be supplied to internal circuits such as a serial-parallel converter, a parallel-serial converter, etc. built in the semiconductor integrated circuit 241.

As an interface for coupling storage media such as an optical disk apparatus, hard disk drive, etc. to a host computer such as a personal computer (PC) or the like, ATA (Advanced Technology Attachment) corresponding to the standard specification is generally used. By using the ATA standard, the various storage media can be coupled to the host computer by the same command and control software. In the eighth embodiment, an optical disk recording/reproducing device is adopted as a storage medium and coupled to the host computer by ATA (ATAPI: Advanced Technology Attachment Packet Interface).

The semiconductor integrated circuit 241 mounted to the optical disk recording/reproducing device according to the eighth embodiment shown in FIG. 24 comprises an ATA interface (ATAPI) 2411 coupled to the host computer 242.

A signal processing unit (READWRITE) 2412 of the semiconductor integrated circuit 241 is coupled to an optical pickup 244 for applying a light beam onto an optical disk 243 used as a storage medium of the optical disk recording/reproducing device to thereby perform reading and writing of data. A reference voltage generator (BGR) 2413 and a crystal oscillator 245 are coupled to the signal processing unit 2412.

Parallel data read from the optical disk 243 is supplied from the signal processing unit 2412 to a serializer 24114. A parallel-serial converter lying inside the serializer 24114 supplies read serial data RX synchronized with a clock CLK generated from a PLL 24115 to the host computer 242.

On the other hand, write serial data TX sent from the host computer 242 is supplied to a clock data recovery unit (CDR) 24112. The clock data recovery unit (CDR) 24112 extracts clock data CLK and serial data contained in the write serial data TX using a PLL 24113 and supplies the same to a deserializer (DES) 24111. The deserializer (DES) 24111 supplies write parallel data synchronized with the supplied clock data CLK to the signal processing unit 2412.

The PLL according to each of the first through seventh embodiments of the present invention is adopted for the PLL 24115 for the data reading and the PLL 24113 for the data writing, both of which have been built in the semiconductor integrated circuit 241 according to the eighth embodiment shown in FIG. 24. It is thus possible to configure the optical disk apparatus capable of stable data reading/writing operations from/to the optical disk 243.

Ninth Embodiment

FIG. 25 is a diagram showing a configuration of an optical disk apparatus equipped with a semiconductor integrated circuit according to a ninth embodiment of the present invention.

A signal processing unit (READWRITE) 2512 of the semiconductor integrated circuit 251 according to the ninth embodiment shown in FIG. 25 has the PLL built therein according to each of the first through seventh embodiments of the present invention.

The semiconductor integrated circuit 251 mounted to an optical disk recording/reproducing device according to the ninth embodiment shown in FIG. 25 also comprises an ATA interface (ATAPI) 2511 coupled to a host computer 252. The ATA interface (ATAPI) 2511 can adopt the same internal configuration as the ATA interface (ATAPI) 2411 of the semiconductor integrated circuit 241 according to the eighth embodiment shown in FIG. 24.

A signal processing unit (READWRITE) 2512 of the semiconductor integrated circuit 251 is coupled to an optical pickup 254 for applying a light beam onto an optical disk 253 used as a storage medium of the optical disk recording/reproducing device to thereby perform reading and writing of data. A reference voltage generator (BGR) 2513 and a crystal oscillator 255 are coupled to the signal processing unit 2512.

Data read from the optical pickup 254 is supplied to a read logic circuit 25123 and a PRML type read signal processing circuit 25124 in the signal processing unit 2512, and hence a clock signal contained in the data read from the optical pickup 254 is reproduced by the PLL lying inside the PRML type read signal processing circuit 25124. Incidentally, PRML is an abbreviation of Partial Response Mostly Likelihood. The read logic circuit 25123 processes the data read from the optical pickup 254 using the clock signal reproduced by the PRML type read signal processing circuit 25124 and supplies the processed data to the ATA interface (ATAPI) 2511.

Write data from the ATA interface (ATAPI) 2511 is supplied to a write logic circuit 25121 of the signal processing unit 2512. The write logic circuit 25121 processes the write data from the ATA interface (ATAPI) 2511 in sync with a clock signal supplied from the corresponding PLL 25122 and supplies it to the optical pickup 254.

The PLL according to each of the first through seventh embodiments of the present invention is adopted for the PLL lying inside the PRML type read signal processing circuit 25124 built in the signal processing unit 2512 of the semiconductor integrated circuit 251 according to the ninth embodiment shown in FIG. 25, and the PLL 25122 for the data writing. It is thus possible to configure an optical disk apparatus capable of stable data reading/writing operations from/to the optical disk 243.

While the invention made above by the present inventors has been described specifically on the basis of the preferred embodiments, the present invention is not limited to the embodiments. It is needless to say that various changes can be made thereto within the scope not departing from the gist thereof.

For example, the selector (SEL) 7 of the PLL according to the seventh embodiment of the present invention shown in FIG. 31 can be substituted with the form of the selector (SEL) 7 of the PLL according to the second embodiment of the present invention shown in FIG. 8. In this case, the frequency characteristic of the voltage controlled oscillator (VCO) 8 can be adjusted to assume a desired characteristic by a calibration operation similar to that for the PLL according to the second embodiment of the present invention described in FIGS. 8 through 11.

Further, the selector (SEL) 7 of the PLL according to seventh embodiment of the present invention shown in FIG. 341 can be substituted with the form of the selector (SEL) 7 of the PLL according to the second embodiment of the present invention shown in FIG. 12. In this case, the frequency characteristic of the voltage controlled oscillator (VCO) 8 can be adjusted to assume a desired characteristic by a calibration operation similar to that for the PLL according to the third embodiment of the present invention described in FIGS. 12 through 18.

Furthermore, the control sensitivities of the currents Ic, Ir, NLIlim and the like based on the adjustment signals T, O, L and G at the voltage-current converter (VIC) 81 shown in each of FIGS. 3, 14 and 18 were adjusted by their settings by the adjustment signals of the selectors 8124 and 8125 coupled to the gates of the MSO transistors 8122 and 8123 as shown in FIG. 4. As described in the patent document 1 as a method other than the above, however, the resistance value of the conversion resistor between the source of the conversion MOS transistor of the voltage-current converter and the ground potential can also be set by the value of each adjustment signal.

What is claimed is:

1. A semiconductor integrated circuit comprising:
a phase locked loop; and
a control unit,
wherein the phase locked loop comprises a phase frequency detector, a loop filter, a voltage controlled oscillator and a divider,
wherein a reference signal and a feedback signal from an output of the divider are respectively capable of being supplied to one input terminal of the phase frequency detector and another input terminal thereof,
wherein an output of the phase frequency detector is supplied to a control input of the voltage controlled oscillator via the loop filter, an oscillation output signal of an output of the voltage controlled oscillator is supplied to an input of the divider, and a frequency of the oscillation output signal of the voltage controlled oscillator is capable of being controlled in response to a control voltage supplied to the control input,
wherein the voltage controlled oscillator comprises a voltage-current converter and a ring oscillator,
wherein the ring oscillator comprises delays of odd-numbered stages,
wherein the voltage-current converter generates a control current in response to the control voltage to thereby set each of operating currents of the delays of the ring oscillator by the control current,
wherein the control unit is capable of switching the phase locked loop to a calibration operating period and a normal operating period,
wherein during the normal operating period, the phase locked loop is controlled to a closed loop by the control unit, whereas during the calibration operating period, the phase locked loop is controlled to an open loop by the control unit,
wherein during the normal operating period, the output of the phase frequency detector is supplied via the loop filter to the control input of the voltage controlled oscillator as the control voltage of a predetermined level at the phase locked loop controlled to the closed loop to thereby bring the frequency of the oscillation output signal of the voltage controlled oscillator to a predetermined frequency determined by the frequency of the reference signal and a division ratio of the divider,
wherein during the calibration operating period, the measurement of the frequency of the oscillation output signal of the voltage controlled oscillator in a state in which a reference voltage approximately equal in level to the control voltage of the predetermined level is being supplied to the control input of the voltage controlled oscillator at the phase locked loop controlled to the open loop, is executed by the control unit, and
wherein the control unit sets a value of a first operation parameter of the voltage-current converter of the voltage controlled oscillator in such a manner that the frequency of the oscillation output signal of the voltage controlled oscillator in the state in which the reference voltage is being supplied to the voltage controlled oscillator becomes approximately equal to the predetermined frequency during the execution of the measurement of the frequency,
wherein the phase locked loop further comprises a selector controlled by the control unit, and
wherein the selector selects the control voltage of the predetermined level during the normal operating period, and the selector selects the reference voltage during the calibration operating period and supplies the selected voltage to the control input of the voltage controlled oscillator,
wherein prior to the setting of the value of the first operation parameter of the voltage-current converter, the measurement of the frequency of the oscillation output signal of the voltage controlled oscillator in a state in which the control voltage having a level of a ground potential is being supplied to the control input of the voltage controlled oscillator of the phase locked loop controlled to the open loop is executed by the control unit during the calibration operating period, and
wherein during the calibration operating period, the control unit sets a value of a second operation parameter of the voltage-current converter of the voltage controlled oscillator, prior to the setting of the value of the first operation parameter of the voltage-current converter in such a manner that the frequency of the oscillation output signal in the state in which the control voltage having the level of the ground potential is being supplied to the voltage controlled oscillator becomes approximately equal to a predetermined offset frequency during the execution of the measurement.

2. The semiconductor integrated circuit according to claim 1, wherein during the calibration operating period, the selector supplies the control voltage having the level of the ground potential to the control input of the voltage controlled oscillator of the phase locked loop controlled to the open loop, prior to the setting of the value of the first operation parameter of the voltage-current converter.

3. The semiconductor integrated circuit according to claim 2,
wherein after the value of the second operation parameter of the voltage-current converter of the voltage controlled oscillator has been set during the calibration operating period, another measurement of the frequency of the oscillation output signal of the voltage controlled oscillator in a state in which another reference voltage higher than the level of the ground potential and lower in level than the control voltage of the predetermined level is being supplied to the control input of the voltage controlled oscillator of the phase locked loop controlled to the open loop is further executed by the control unit, and wherein during the calibration operating period, the control unit sets the value of the first operation parameter of the voltage-current converter of the voltage controlled oscillator in such a manner that the frequency of the oscillation output signal in the state in which the other reference voltage is being supplied to the voltage controlled oscillator becomes approximately equal to another predetermined frequency lower than the predetermined frequency.

4. The semiconductor integrated circuit according to claim 3, wherein after the value of the second operation parameter has been set during the calibration operating period, the selector supplies the other reference voltage to the control input of the voltage controlled oscillator of the phase locked loop controlled to the open loop.

5. The semiconductor integrated circuit according to claim 4, wherein the phase locked loop further comprises a charge pump which performs charge/discharge of the loop filter in response to the output of the phase frequency detector.

6. The semiconductor integrated circuit according to claim 5, wherein the charge pump comprises a first charge pump and a second charge pump, wherein the first charge pump and the second charge pump are driven in antiphase to each other in response to an up output signal and a down output signal each used as the output of the phase frequency detector to set a first charge/discharge current of the first charge pump and a second charge/discharge current of the second charge pump to a predetermined ratio, wherein the loop filter comprises a resistor and a capacitor for determining a zero point frequency, and one end of the resistor is coupled to an input terminal of the loop filter and another end thereof is coupled to a ground potential via the capacitor, wherein the one and other ends of the resistor of the loop filter are respectively driven by the first charge/discharge current of the first charge pump and the second charge/discharge current of the second charge pump, and wherein the resistor and the capacitor of the loop filter are built in a semiconductor chip.

7. The semiconductor integrated circuit according to claim 6, which is capable of being coupled between a pickup for performing data reading and writing of a disk used as a storage media of a disk recording/reproducing device, and a host computer, the semiconductor integrated circuit comprising:

a host interface that supplies read data to the host computer and is supplied with write data from the host computer; and a signal processing unit that performs processing of a signal read from the pickup and performs processing of a signal written into the pickup, wherein the phase locked loop generates a clock signal used in at least one of the host interface and the signal processing unit.

8. The semiconductor integrated circuit according to claim 7, wherein the host interface is an ATA interface.

* * * * *